(12) United States Patent
Soma et al.

(10) Patent No.: US 7,719,081 B2
(45) Date of Patent: May 18, 2010

(54) SEMICONDUCTOR DEVICE AND METHOD OF MANUFACTURING THE SAME

(75) Inventors: Mitsuru Soma, Saitama (JP); Hirotsugu Hata, Gunma (JP); Minoru Akaishi, Gunma (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 11/635,813

(22) Filed: Dec. 8, 2006

(65) Prior Publication Data

US 2007/0145530 A1 Jun. 28, 2007

(30) Foreign Application Priority Data

Dec. 9, 2005 (JP) ............................ 2005-356009

(51) Int. Cl.
*H01L 21/8228* (2006.01)
(52) U.S. Cl. .................... 257/511; 257/565; 438/322
(58) Field of Classification Search .............. 257/511
See application file for complete search history.

(56) References Cited

U.S. PATENT DOCUMENTS

| | | | |
|---|---|---|---|
| 4,902,633 A | | 2/1990 | Cambou |
| 5,274,267 A * | | 12/1993 | Moksvold .................. 257/592 |
| 5,455,447 A | | 10/1995 | Hutter et al. |
| 5,565,701 A | | 10/1996 | Zambrano |
| 5,731,617 A | | 3/1998 | Suda |
| 5,786,265 A | | 7/1998 | Hwang et al. |
| 5,798,560 A | | 8/1998 | Ohkawa et al. |
| 6,590,273 B2 * | | 7/2003 | Okawa et al. ............... 257/544 |
| 6,822,298 B2 | | 11/2004 | Kaneko et al. |
| 7,067,899 B2 * | | 6/2006 | Kanda et al. ................ 257/556 |
| 2002/0079554 A1 | | 6/2002 | Okawa et al. |
| 2003/0141530 A1 | | 7/2003 | Kaneko et al. |
| 2005/0077571 A1 * | | 4/2005 | Kanda et al. ................ 257/337 |
| 2007/0145520 A1 | | 6/2007 | Soma |
| 2007/0158754 A1 | | 7/2007 | Soma |

FOREIGN PATENT DOCUMENTS

| | | |
|---|---|---|
| CN | 1138749 | 12/1996 |
| CN | 1361552 | 7/2002 |
| CN | 1428864 | 7/2003 |

(Continued)

OTHER PUBLICATIONS

Korean Office Action dated Oct. 30, 2007, directed to related KR application No. 2007-058476485.

(Continued)

*Primary Examiner*—Thao X Le
*Assistant Examiner*—Kimberly Trice
(74) *Attorney, Agent, or Firm*—Morrison & Foerster LLP

(57) ABSTRACT

In a semiconductor device of the present invention, an epitaxial layer is formed on a P type single crystal silicon substrate. Isolation regions are formed in the epitaxial layer, and are divided into a plurality of element formation regions. An NPN transistor is formed in one of the element formation regions. An N type diffusion layer is formed between a P type isolation region and a P type diffusion layer which is used as a base region of the NPN transistor. This structure makes the base region and the isolation region tend not to be short-circuited. Hence, the breakdown voltage characteristics of the NPN transistor can be improved.

8 Claims, 17 Drawing Sheets

FOREIGN PATENT DOCUMENTS

| | | |
|---|---|---|
| CN | 1604329 | 4/2005 |
| JP | 09-283646 | 10/1997 |
| KR | 100175368 | 11/1998 |

OTHER PUBLICATIONS

Soma et al., U.S. Office Action mailed Sep. 15, 2008, directed to U.S. Appl. No. 11/635,077; (19 pages).

Soma et al., U.S. Office Action mailed Feb. 18, 2009, directed to U.S. Appl. No. 11/635,077; (19 pages).

Soma et al., U.S. Office Action mailed Jul. 13, 2009, directed to U.S. Appl. No. 11/635,077; (13 pages).

Soma et al., U.S. Office Action mailed Jun. 27, 2008, directed to U.S. Appl. No. 11/635,812; (7 pages).

Soma et al., U.S. Office Action mailed Dec. 24, 2008, directed to U.S. Appl. No. 11/635,812; (7 pages).

Soma et al., U.S. Office Action mailed Jan. 28, 2010, directed to U.S. Appl. No. 11/635,077; 16 pages.

* cited by examiner

Prior Art

SEMICONDUCTOR DEVICE AND METHOD OF MANUFACTURING THE SAME

Priority is claimed to Japanese Patent Application Number JP2005-356009 filed on Dec. 9, 2005, the disclosure of which is incorporated herein by reference in its entirety.

BACKGROUND OF THE INVENTION

1. Field of the Invention

The present invention relates to a semiconductor device which realizes reduction in a device size while maintaining breakdown voltage characteristics, and a method of manufacturing the semiconductor device.

2. Description of the Prior Art

As an example of a conventional semiconductor device, a structure of the following NPN transistor 131 has been known. As shown in FIG. 17, an N type epitaxial layer 133 is formed on a P type semiconductor substrate 132. In the epitaxial layer 133, P type buried diffusion layers 134 and 135 and P type diffusion layers 136 and 137 are formed. The P type buried diffusion layers 134 and 135 expand vertically (in a depth direction) from a surface of the substrate 132. The P type diffusion layers 136 and 137 expand from a surface of the epitaxial layer 133. The epitaxial layer 133 is divided into a plurality of element formation regions by isolation regions 138 and 139 which are formed by connecting the P type buried diffusion layers 134 and 135 respectively with the P type diffusion layers 136 and 137. In one of the element formation regions, for instance, the NPN transistor 131 is formed. The NPN transistor 131 is mainly configured of: an N type buried diffusion layer 140 and an N type diffusion layer 141, which are used as a collector region: a P type diffusion layer 142 used as a base region; and an N type diffusion layer 143 used as an emitter region. This technology is described for instance in Japanese Patent Application Publication No. Hei 9(1997)-283646 (Pages 3, 4 and 6, FIGS. 1 and 5 to 7).

As described, in the conventional semiconductor device, the epitaxial layer 133 is formed on the semiconductor substrate 132. The NPN transistor 131 is formed in the epitaxial layer 133 partitioned by the isolation regions 138 and 139. The epitaxial layer 133 is a region having a lower N type impurity concentration. In this structure, when formation regions of the P type buried diffusion layer 134 and the P type diffusion layer 142 are shifted, a distance L3 between the diffusing layers 134 and 142 is shortened, and a depletion layer stretches over a narrower region. In the NPN transistor 131, the base region and the isolation region is prevented from being short-circuited. This results in a problem that it is difficult to obtain desired breakdown voltage characteristics of the NPN transistor 131. A problem is also caused in which the breakdown voltage characteristics of the NPN transistor 131 are not stable due to a variation in the distance L3.

In the conventional semiconductor device, a thickness of the epitaxial layer 133 is determined in consideration of the breakdown voltage of the NPN transistor 131 or the like. For instance, in a case where a power semiconductor element and a control semiconductor element are monolithically formed on the same semiconductor substrate 132, the thickness of the epitaxial layer 133 is determined depending on breakdown voltage characteristics of the power semiconductor element. The P type buried diffusion layers 134 and 135, which form respectively the isolation regions 138 and 139, expand upward from a surface of the substrate 132 toward the epitaxial layer 133. On the other hand, the P type diffusion layers 136 and 137, which respectively form the isolation regions 138 and 139, expand downward from a surface of the epitaxial layer 133. By use of this structure, lateral expansion widths W4 and W5 respectively of the P type buried diffusion layers 134 and 135 are also increase according to the upward expansion width thereof. In order to realize desired breakdown voltage characteristics of the NPN transistor 131, it is required that the distance L3 between the P type diffusion layer 142 and the P type buried diffusion layer 134 of the isolation region 138 be a certain distance or longer. Thus, there is a problem that the increase in the lateral expansion width W4 and W5 respectively of the P type buried diffusion layers 134 and 135 makes it difficult to reduce a device size of the NPN transistor 131.

SUMMARY OF THE INVENTION

The present invention has been made in view of the problems described above. A first semiconductor device of the present invention includes a semiconductor substrate of one conductivity type, an epitaxial layer of an opposite conductivity type formed on the semiconductor substrate, a isolation region of the one conductivity type which divides the epitaxial layer into a plurality of element formation regions, a buried diffusion layer of the opposite conductivity type, which is formed so as to expand in the semiconductor substrate and the epitaxial layer, a first diffusion layer of the opposite conductivity type, which is formed in the epitaxial layer, and which is used as a collector region, a diffusion layer of the one conductivity type, which is formed in the epitaxial layer, and which is used as a base region, and a second diffusion layer of the opposite conductivity type, which is formed in the diffusion layer of the one conductivity type, and which is used as an emitter region. In the epitaxial layer of the semiconductor device, a third diffusion layer of the opposite conductivity type is formed between the isolation region and the diffusion layer of the one conductivity type. In the present invention, therefore, the diffusion layer of the opposite conductivity type is formed between the isolation region of the one conductivity type and the diffusion layer of the one conductivity type used which are the base region. This structure increases a concentration of impurities of the opposite conductivity type, and makes the base region and the isolation region tend not to be short-circuited. Thereby, breakdown voltage characteristics of the semiconductor device can be improved.

The first semiconductor device of the present invention includes the diffusion layer of the one conductivity type is surrounded by the first and third diffusion layers of the opposite conductivity type. In the present invention, therefore, the diffusion layers of the opposite conductivity type surrounds the diffusion layer of the one conductivity type used as the base region. This structure makes the base region and the isolation region tend not to be short-circuited. Thereby, the breakdown voltage characteristics can be improved.

A second semiconductor device of the present invention includes a semiconductor substrate of one conductivity type, a first epitaxial layer of an opposite conductivity type formed on the semiconductor substrate, a second epitaxial layer of the opposite conductivity type formed on the first epitaxial layer, a isolation region of the one conductivity type, which divides the first and second epitaxial layers into a plurality of element formation regions, a first buried diffusion layer of the opposite conductivity type formed so as to expand in the semiconductor substrate and the first epitaxial layer, a first diffusion layer of the opposite conductivity type, which is formed in the second epitaxial layer, and which is used as a collector region, a first diffusion layer of the one conductivity type, which is formed in the second epitaxial layer, and which is used as a base region, and a second diffusion layer of the opposite conductivity type, which is formed in the first diffusion layer of the one conductivity type, and which is used as an emitter region. In the semiconductor device, a second buried diffusion layer of the opposite conductivity type is formed so as to expand in the first and second epitaxial layers. A third diffusion layer of the opposite conductivity type is formed in the second epitaxial layer. The second buried diffusion layer of the opposite conductivity type and the third diffusion layer of the opposite conductivity type are connected, and are disposed between the isolation region and the first diffusion layer of the one conductivity type. Also in the structure of the present invention, therefore, in which the two epitaxial layers are stacked on the substrate, the diffusion layers of the opposite conductivity type are formed between the isolation region of the one conductivity type and the diffusion layer of the one conductivity type used which are the base region. This structure makes the base region and the isolation region tend not to be short-circuited. Thereby, the breakdown voltage characteristics of the semiconductor device can be improved.

The second semiconductor device of the present invention further includes a buried diffusion layer of the one conductivity type, which forms the isolation region, which is formed from the surface of the first epitaxial layer, and which is connected to the semiconductor substrate, and a second diffusion layer of the one conductivity type, which forms the isolation region, which is formed from the surface of the second epitaxial layer, and which is connected to the buried diffusion layer of the one conductivity type. In the present invention, therefore, the buried diffusion layer of the one conductivity type, which forms the isolation region, is prevented from expanding laterally. Thereby, it is possible to reduce the device size.

A first method of manufacturing a semiconductor device of the present invention includes the steps preparing a semiconductor substrate of one conductivity type, forming first and second buried diffusion layers of an opposite conductivity type in the semiconductor substrate, forming a buried diffusion layer of the one conductivity type in the semiconductor substrate, forming an epitaxial layer of the opposite conductivity type on the semiconductor substrate, forming a first diffusion layer of the opposite conductivity type, which is used as a collector region, in the epitaxial layer, forming a first diffusion layer of the one conductivity type, which is used as a base region, in the epitaxial layer, forming a second diffusion layer of the opposite conductivity type, which is used as an emitter region, in the first diffusion layer of the one conductivity type, forming third and fourth diffusion layers of the opposite conductivity type in the epitaxial layer by the same ion implanting step, the third diffusion layer being disposed between the isolation region and the first diffusion layer of the one conductivity type, the fourth diffusion layer being used as a back gate region, and forming second and third diffusion layers of the one conductivity type in the fourth diffusion layer of the opposite conductivity type, the second diffusion layer being used as a source region, and the third diffusion layer being used as a drain region. In the present invention, therefore, the third and fourth diffusion layers of the opposite conductivity type are formed by the same step, the third diffusion layer being that for improving breakdown voltage characteristics of the semiconductor device, and the fourth diffusion layer being used as the back gate region. Because of this manufacturing method, the number of masks can be reduced. Thereby, manufacturing costs can be kept lower.

A second method of manufacturing a semiconductor device of the present invention includes the steps preparing a semiconductor substrate of one conductivity type, forming first and second buried diffusion layers of an opposite conductivity type in the semiconductor substrate, and thereafter forming a first epitaxial layer of the opposite conductivity type on the semiconductor substrate, forming a third buried diffusion layer of the opposite conductivity type in the first epitaxial layer, implanting ions of impurities of the one conductivity type into a desired region of the first epitaxial layer, thereafter forming a second epitaxial layer of the opposite conductivity type on the first epitaxial layer, and forming a buried diffusion layer of the one conductivity type so as to expand in the first and second epitaxial layers, forming a first diffusion layer of the opposite conductivity type, which is used as a collector region, in the second epitaxial layer, forming a first diffusion layer of the one conductivity type, which is used as a base region in the second epitaxial layer, forming a second diffusion layer of the opposite conductivity type, which is used as an emitter region, in the first diffusion layer of the one conductivity type, forming a second diffusion layer of the one conductivity type, which is connected to the buried diffusion layer of the one conductivity type, in the second epitaxial layer, forming third and fourth diffusion layers of the opposite conductivity type in the second epitaxial layer by the same ion implanting step, the third diffusion layer being disposed between the first dispersion layer of the one conductivity type and the second diffusion layer of the one conductivity type, and the fourth diffusion layer being used as a back gate region, and forming third and fourth diffusion layers of the one conductivity type in the fourth diffusion layer of the opposite conductivity type, the third diffusion layer being used as a source region, and the fourth diffusion layer being used as a drain region. In the present invention, therefore, also in the structure in which the two epitaxial layers are stacked on the substrate, by making the third diffusion layers of the opposite conductivity type which improves the breakdown voltage characteristics of the semiconductor device in a common step, the number of masks can be reduced. Thereby, manufacturing costs can be kept lower.

The second method of manufacturing a semiconductor device of the present invention includes, after the second epitaxial layer is formed, an ion implanting step for forming the second diffusion layers of the one conductivity type is performed without performing of a thermal diffusion step for expanding the buried diffusion layer of the one conductivity type. In the present invention, therefore, the thickness of the first epitaxial layer is adjusted so as to omit the thermal diffusion step dedicated for at the buried diffusion layer of the one conductivity type. Hence, it is possible to realize the reduced lateral expansion width of the buried diffusion layer of the one conductivity type.

The second method of manufacturing a semiconductor device of the present invention includes an LOCOS oxide film is formed in the second epitaxial layer, and thereafter ions of impurities of the one conductivity type form the second diffusion layer of the one conductivity type are implanted from an upper surface of the LOCOS oxide film for. In the present invention, therefore, it is possible to reduce crystal defects in the formation region of the second diffusion layer of the one conductivity type.

DESCRIPTION OF PREFERRED EMBODIMENTS

Figure 1:
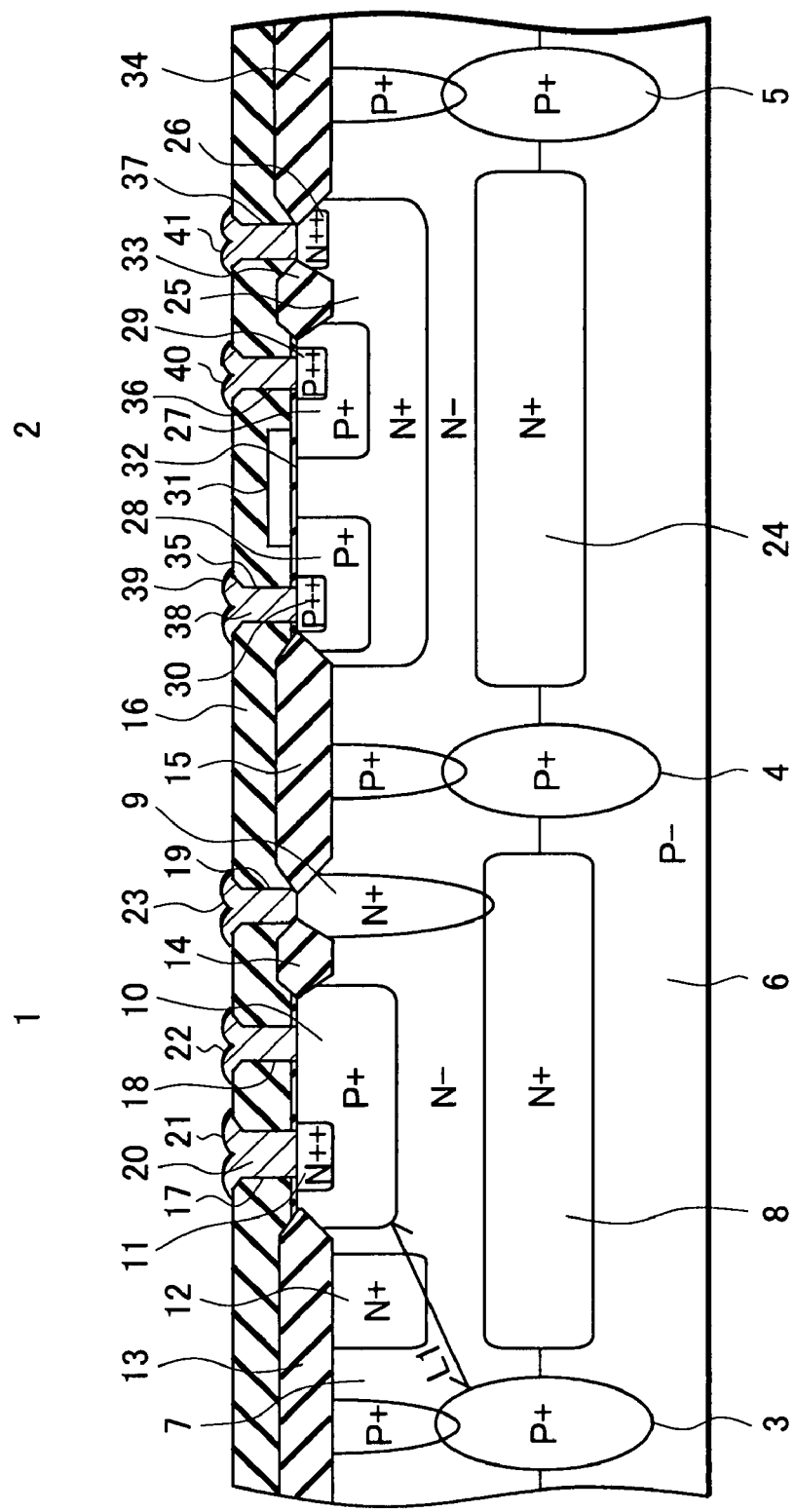
FIG. 1 is a cross-sectional view illustrating a semiconductor device according to an embodiment of the present invention.
Figure 2:
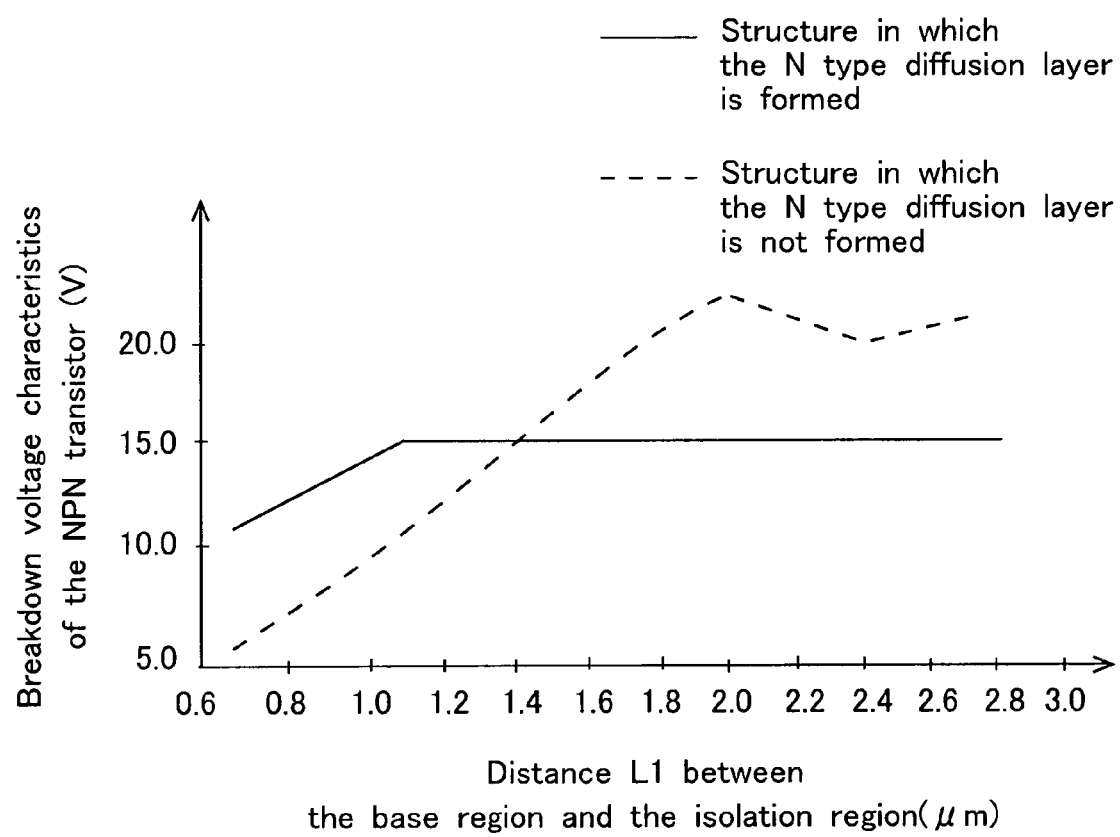
FIG. 2 is a graph illustrating breakdown voltage characteristics of the semiconductor device according to the embodiment of the present invention.

By referring to FIGS. 1 and 2, detailed descriptions will be provided below for a first example of a semiconductor device according to an embodiment of the present invention. FIG. 1 is a cross-sectional view illustrating the semiconductor device of the embodiment. FIG. 2 is a graph illustrating breakdown voltage characteristics of the semiconductor device of the embodiment.

As shown in FIG. 1, an NPN transistor 1 is formed in one of element formation regions divided by isolation regions 3, 4 and 5, and a P channel MOS (Metal Oxide Semiconductor) transistor 2 is formed in a different element formation region. Note that, although not shown in FIG. 1, an N channel MOS transistor, a PNP transistor and the like are formed in other element formation regions.

As shown in FIG. 1, the NPN transistor 1 is mainly formed of a P type single crystal silicon substrate 6, an N type epitaxial layer 7, an N type buried diffusion layer 8 used as a collector region, an N type diffusion layer 9 used as the collector region, a P type diffusion layer 10 used as a base region, an N type base diffusion layer 11 used as an emitter region, and an N type diffusion layer 12.

The N type epitaxial layer 7 is formed on the P type single crystal silicon substrate 6.

The N type buried diffusion layer 8 is formed so as to expand in the substrate 6 and the epitaxial layer 7.

The N type diffusion layer 9 is formed in the epitaxial layer 7. The N type diffusion layer 9 is connected to the N type buried diffusion layer 8. The N type buried diffusion layer 8 and the N type diffusion layer 9 are used as the collector region of the NPN transistor 1.

The P type diffusion layer 10 is formed in the epitaxial layer 7, and is used as the base region.

The N type diffusion layer 11 is formed in the P type diffusion layer 10, and is used as the emitter region.

The N type diffusion layer 12 is formed in the epitaxial layer 7. The N type diffusion layer 12 is disposed between the isolation region 3 and the P type diffusion layer 10 used as the base region. As shown in FIG. 1, the N type diffusion layer 12 exists between the P type diffusion layer 10 and the isolation region 3, and is disposed in a region where the N type diffusion layer 9 is not disposed. The N type diffusion layer 9 and the N type diffusion layer 12 are disposed to surround the P type diffusion layer 10. Alternatively, the N type diffusion layer 12 may be disposed in the shape of a ring and may be disposed to surround the P type diffusion layer 10.

LOCOS oxide films 13, 14 and 15 are formed in the epitaxial layer 7. Each of the LOCOS oxide films 13, 14 and 15 has a thickness of, for instance, about 3000 to 10000 (Å) in its flat portion. Below the LOCOS oxide films 13 and 15, the P type isolation regions 3 and 4 are respectively formed.

An insulating layer 16 is formed on an upper face of the epitaxial layer 7. The insulating layer 16 is formed of an NSG (Nondoped Silicate Glass) film, a BPSG (Boron Phospho Silicate Glass) film or the like. By use of a known photolithography technique, contact holes 17, 18 and 19 are formed in the insulating layer 16 by dry etching using, for instance, $CHF_3$ or $CF_4$ gas.

In the contact holes 17, 18 and 19, aluminum alloy films 20 made of, for instance, an Al—Si film, an Al—Si—Cu film, an Al—Cu film or the like are selectively formed. Thus, an emitter electrode 21, a base electrode 22 and a collector electrode 23 are formed.

Meanwhile, the P channel MOS transistor 2 is mainly formed of the P type single crystal silicon substrate 6, the N type epitaxial layers 7, an N type buried diffusion layer 24, N type diffusion layers 25 and 26 used as a back gate region, P type diffusion layers 27 and 29 used as a source region, P type diffusion layers 28 and 30 used as a drain region, and a gate electrode 31.

The N type epitaxial layer 7 is formed on the P type single crystal silicon substrate 6.

The N type buried diffusion layer 24 is formed so as to expand in the substrate 6 and the epitaxial layer 7.

The N type diffusion layer 25 is formed in the epitaxial layer 7, and is used as the back gate region. In the N type diffusion layer 25, the N type diffusion layer 26 is formed in a way that formation regions of the N type diffusion layers 25 and 26 overlap. The N type diffusion layer 26 is used as a back gate draw-out region.

The P type diffusion layers 27 and 28 are formed in the N type diffusion layer 25. The P type diffusion layer 27 is used as the source region. The P type diffusion layer 28 is used as the drain region. The P type diffusion layer 29 is formed in the P type diffusion layer 27, and the P type diffusion layer 30 is formed in the P type diffusion layer 28. As a result, the drain region has a DDD (Double Diffused Drain) structure. The N type diffusion layer 25 positioned between the P type diffusion layers 27 and 28 is used as a channel region. On the upper face of the epitaxial layer 7 above the channel region, a gate oxide film 32 is formed.

The gate electrode 31 is formed on the upper face of the gate oxide film 32. The gate electrode 31 is formed of, for instance, a polysilicon film and a tungsten silicide film, and so as to have a desired thickness. Although not shown in FIG. 1, a silicon oxide film is formed on an upper surface of the tungsten silicide film.

LOCOS oxide films 15, 33 and 34 are formed in the epitaxial layer 7.

The insulating layer 16 is formed on the upper face of the epitaxial layer 7. By use of the known photolithography technique, contact holes 35, 36 and 37 are formed in the insulating layer 16 by dry etching using, for instance, $CHF_3$ or $CF_4$ gas.

In the contact holes 35, 36 and 37, aluminum alloy films 38 made of, for example, the Al—Si film, the Al—Si—Cu film, the Al—Cu film or the like are selectively formed. Thus, a drain electrode 39, a source electrode 40 and a back gate electrode 41 are formed.

As described, the N type diffusion layer 12 is disposed between the P type isolation region 3 and the P type diffusion layer 10 used as the base region. Because of the disposition of the N type diffusion layer 12, an impurity concentration of the epitaxial layer 7 between the P type isolation region 3 and the P type diffusion layer 10 is increased. The N type diffusion layer 12 in the structure makes a depletion layer, which stretches from a PN junction region between the P type diffusion layer 10 and the N type epitaxial layer 7, tend not to stretch to a side of the N type epitaxial layer 7. Similarly, the N type diffusion layer 12 also makes a depletion layer, which stretches from a PN junction region between the P type isolation region 3 and the N type epitaxial layer 7, tend not to stretch to a side of the N type epitaxial layer 7. To this end, by adjusting the stretching of the depletion layers by means of the N type diffusion layer 12, it is possible to make the base region and the isolation region tend not to be short-circuited. Thereby, breakdown voltage characteristics of the NPN transistor 1 can be improved.

In FIG. 2, an abscissa indicates a distance L1 between the base region (P type diffusion layer 10) and the isolation region 3, and an ordinate indicates the breakdown voltage characteristics of the NPN transistor 1. A solid line shows a structure in which the N type diffusion layer 12 is formed, and the dotted line shows a structure in which the N type diffusion layer 12 is not formed. Note that, the distance L1 is between the P type isolation region 3 and the P type diffusion layer 10 affecting the breakdown voltage characteristics of the NPN transistor 1.

As the solid line shows, the longer the distance L1 is, the more the breakdown voltage characteristics of the NPN transistor 1 are improved when the distance L1 is not longer than about 1.1 μm. The breakdown voltage of the NPN transistor 1 are stable at approximately 15.0 V when the distance L1 is longer than about 1.1 μm. In other words, by forming the N type diffusion layer 12 in the NPN transistor 1, it is possible to reduce the influence of the distance L1 and obtain the stable breakdown voltage characteristics.

As the dotted line shows, in a case where the N type diffusion layer 12 is not formed, on the other hand, the longer the distance L1 is, the more the breakdown voltage characteristics of the NPN transistor 1 are improved. However, compared with the case shown by the solid line, it is understood that the breakdown voltage characteristics of the NPN transistor 1 are not stable. Especially when the distance L1 is not longer than about 2.0 μm, the breakdown voltage characteristics of the NPN transistor 1 significantly vary depending on the distance L1. Hence, it is difficult to reduce the device size of the NPN transistor 1.

Note that, in the embodiment, various design modifications can be made for a disposition region of the N type diffusion layer 12, depending on the breakdown voltage characteristics of the NPN transistor 1. For instance, the N type diffusion layer 12 is not necessarily disposed in a region where the N type diffusion layer 9 is disposed between, for instance, the P type diffusion layer 10 and any of the P type isolation regions 3 and 4. In addition, the N type diffusion layer 12 is not necessarily disposed in a region where desired breakdown voltage characteristics are secured because of the distance L1 between the P type diffusion layer 10 and any of the P type isolation regions 3 and 4. In other words, it suffices that the N type diffusion layer 12 is at least disposed in a region where the N type diffusion layer 9 is not formed between the P type diffusion layer 10 and each of the P type isolation regions 3 and 4, and where the distance L1 between the P type diffusion layer 10 and each of the P type isolation regions 3 and 4 is shorter. In this embodiment, the descriptions have been provided for the case where the one epitaxial layer 7 is formed on the substrate 6. However, the present invention is not limited to this case. For instance, even in a case where a plurality of epitaxial layers are stacked on a substrate, it is possible to obtain similar effects of the embodiment by forming an N type diffusion layer between a base region and a isolation region. Furthermore, various kinds of modifications can be made without departing from the scope of the present invention.

Figure 3:
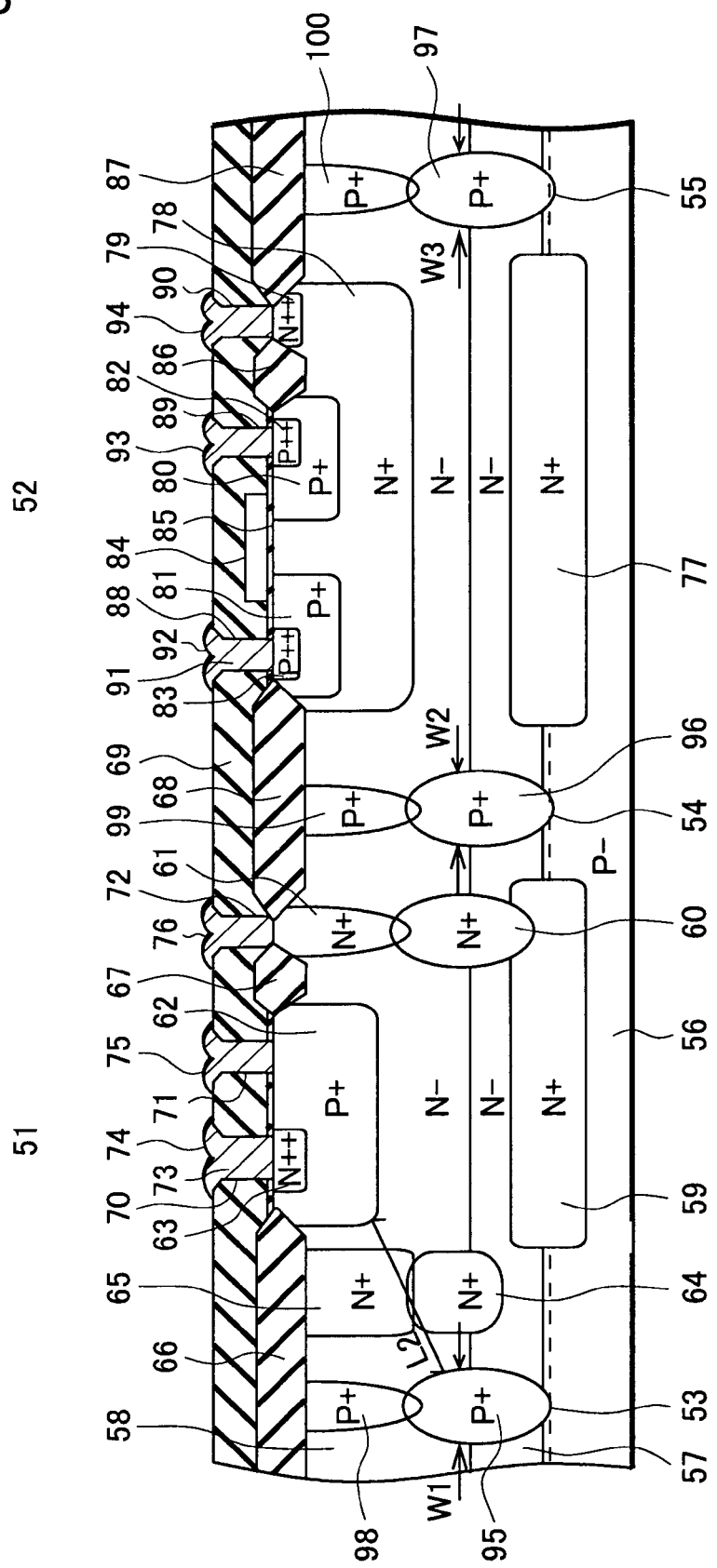
FIG. 3 is a cross-sectional view illustrating another semiconductor device according to an embodiment of the present invention.
Figure 4:
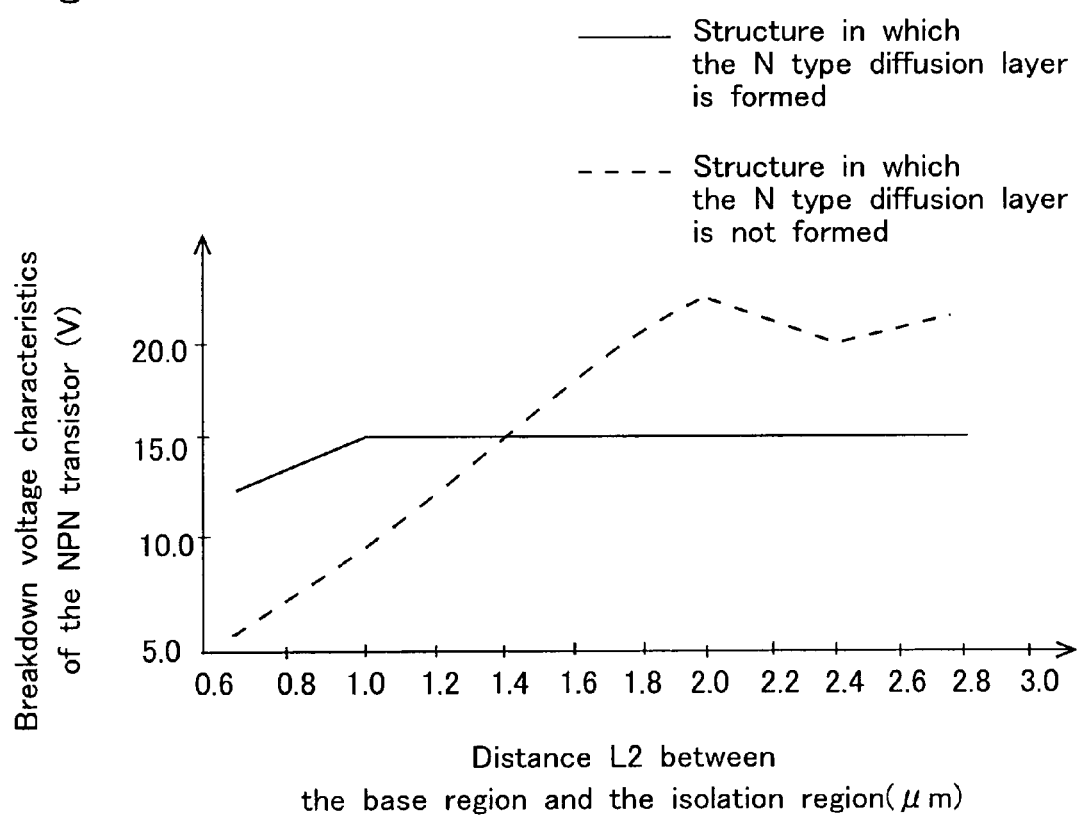
FIG. 4 is a graph illustrating breakdown voltage characteristics of the semiconductor device of FIG. 3 according to the embodiment of the present invention.

By referring to FIGS. 3 and 4, detailed descriptions will be provided below for a second example of the semiconductor device according to an embodiment of the present invention. FIG. 3 is a cross-sectional view illustrating the semiconductor device according to the embodiment. FIG. 4 is a graph illustrating breakdown voltage characteristics of the semiconductor device according to the embodiment.

As shown in FIG. 3, an NPN transistor 51 is formed in one of element formation regions divided by isolation regions 53, 54, 55, and a P channel MOS (Metal Oxide Semiconductor) transistor 52 is formed in a different element formation region. Note that, although not shown in FIG. 3, an N channel MOS transistor, a PNP transistor and the like are formed in other element formation regions.

As shown in FIG. 3, the NPN transistor 51 is mainly formed of a P type single crystal silicon substrate 56, N type epitaxial layers 57 and 58, N type buried diffusion layers 59 and 60 which are used as a collector region, an N type diffusion layer 61 used as the collector region, a P type diffusion layer 62 used as a base region, an N type diffusion layer 63 used as an emitter region, an N type buried diffusion layer 64, and an N type diffusion layer 65.

The N type epitaxial layers 57 and 58 are formed on the P type single crystal silicon substrate 56. Specifically, on the substrate 56, the two epitaxial layers 57 and 58 are stacked. The first epitaxial layer 57 is formed as having a thickness of, for instance, about 0.6 to 1.0 μm). Meanwhile, the second epitaxial layer 58 is formed as having a thickness of, for instance, about 1.0 to 1.5 μm).

The N type buried diffusion layer 59 is formed so as to expand in the substrate 56 and the first epitaxial layer 57. The N type buried diffusion layer 60 is formed so as to expand in the first and second epitaxial layers 57 and 58. The N type buried diffusion layer 60 is connected to the N type buried diffusion layer 59.

The N type diffusion layer 61 is formed in the second epitaxial layer 58. The N type diffusion layer 61 is connected to the N type buried diffusion layer 60. The N type buried diffusion layers 59 and 60 and the N type diffusion layer 61 are used as the collector region of the NPN transistor 51.

The P type diffusion layer 62 is formed in the second epitaxial layer 58, and is used as the base region. The N type diffusion layer 63 is formed in the P type diffusion layer 62, and is used as the emitter region.

The N type buried diffusion layer 64 is formed so as to expand in the first and second epitaxial layers 57 and 58. The N type buried diffusion layer 64 exists between the P type diffusion layer 62 and the isolation region 53, and is disposed in a region where the N type buried diffusion layer 60 is not disposed.

The N type diffusion layer 65 is formed in the second epitaxial layer 58. The N type diffusion layer 65 exists between the P type diffusion layer 62 and the isolation region 53, and is disposed in a region where the N type diffusion layer 61 is not disposed. The N type diffusion layer 65 is connected to the N type buried diffusion layer 64. The N type diffusion layer 65 and the N type diffusion layer 61 are disposed to surround the P type diffusion layer 62. Alternatively, the N type diffusion layer 65 and the N type buried diffusion layer 64 are may be deposited in the shape of a ring to surround the P type diffusion layer 62.

LOCOS oxide films 66, 67 and 68 are formed in the second epitaxial layer 58. Each of the LOCOS oxide films 66, 67 and 68 has a thickness of, for instance, about 3000 to 10000 (Å) in its flat portion. Below the LOCOS oxide films 66 and 68, the P type isolation regions 53 and 54 are respectively formed.

An insulating layer 69 is formed on an upper face of the second epitaxial layer 58. The insulating layer 69 is formed of an NSG (Nondoped Silicate Glass) film, a BPSG (Boron Phospho Silicate Glass) film or the like. By use of a known photolithography technique, contact holes 70, 71 and 72 are formed in the insulating layer 69 by dry etching using, for instance, $CHF_3$ or $CF_4$ gas.

In the contact holes 70, 71 and 72, aluminum alloy films 73 made of, for instance, an Al—Si film, an Al—Si—Cu film, an Al—Cu film or the like are selectively formed. Thus, an emitter electrode 74, a base electrode 75 and a collector electrode 76 are formed.

Meanwhile, the P channel MOS transistor 52 is mainly formed of the P type single crystal silicon substrate 56, the N type epitaxial layers 57 and 58, an N type buried diffusion layer 77, N type diffusion layers 78 and 79 used as a back gate region, P type diffusion layers 80 and 82 used as a source region, P type diffusion layers 81 and 83 used as a drain region, and a gate electrode 84.

The N type epitaxial layers 57 and 58 are formed on the P type single crystal silicon substrate 56.

The N type buried diffusion layer 77 is formed so as to expand in the substrate 56 and the first epitaxial layer 57.

The N type diffusion layer 78 is formed in the second epitaxial layer 58, and is used as the back gate region. In the N type diffusion layer 78, the N type diffusion layer 79 is formed in a way that formation regions of the N type diffusion layers 78 and 79 overlap. The N type diffusion layer 79 is used as a back gate draw-out region.

The P type diffusion layers 80 and 81 are formed in the N type diffusion layer 78. The P type diffusion layer 80 is used as the source region. The P type diffusion layer 81 is used as the drain region. The P type diffusion layer 82 is formed in the P type diffusion layer 80, and the P type diffusion layer 83 is formed in the P type diffusion layer 81. In this structure, the drain region has a DDD (Double Diffused Drain) structure. The N type diffusion layer 78 positioned between the P type diffusion layers 80 and 81 is used as a channel region. A gate oxide film 85 is formed on an upper face of the epitaxial layer 58 above the channel region.

The gate electrode 84 is formed on the upper face of the gate oxide film 85. The gate electrode 84 is formed of, for instance, a polysilicon film and a tungsten silicide film so as to have a desired thickness. Although not shown in FIG. 3, a silicon oxide film is formed on an upper face of the tungsten silicide film.

LOCOS oxide films 68, 86 and 87 are formed in the second epitaxial layer 58.

The insulating layer 69 is formed on the upper face of the second epitaxial layer 58. By use of the known photolithography technique, contact holes 88, 89 and 90 are formed in the insulating layer 69 by dry etching using, for instance, the $CHF_3$ or $CF_4$ gas.

In the contact holes 88, 89 and 90, aluminum alloy films 91 made of, for instance, the Al—Si film, the Al—Si—Cu film, the Al—Cu film or the like are selectively formed. Thus, a drain electrode 92, a source electrode 93 and a back gate electrode 94 are formed.

As described, the N type buried diffusion layer 64 and the N type diffusion layer 65, which are connected to each other, are disposed between the P type isolation region 53 and the P type diffusion layer 62 used as the base region. Because of the disposition of the N type buried diffusion layer 64 and the N type diffusion layer 65, the epitaxial layers 57 and 58 have a higher impurity concentration between the P type diffusion layer 62 and the P type isolation region 53. The N type buried diffusion layer 64 and the N type diffusion layer 65 in the structure make a depletion layer, which stretches from a PN junction region between the P type diffusion layer 62 and the N type epitaxial layer 58, tend not to stretch to a side of the N type epitaxial layers 57 and 58. Similarly, the N type buried diffusion layer 64 and the N type diffusion layer 65 also make a depletion layer, which stretches from a PN junction region between the P type isolation region 53 and the N type epitaxial layers 57 and 58, tend not to stretch to a side of the N type epitaxial layers 57 and 58. To this end, by adjusting the stretching of the depletion layers by means of the N type buried diffusion layer 64 and the N type diffusion layer 65, it is possible to make the base region and the isolation region tend not to be short-circuited. Thereby, breakdown voltage characteristics of the NPN transistor 51 can be improved.

In FIG. 4, an abscissa indicates a distance L2 between the base region (P type diffusion layer 62) and the isolation region 53, and an ordinate indicates the breakdown voltage characteristics of the NPN transistor 51. A solid line shows a structure in which the N type buried diffusion layer 64 and the N type diffusion layer 65 are formed. A dotted line shows a structure in which the N type buried diffusion layer 64 and the N type diffusion layer 65 are not formed. Note that, the distance L2 is between the P type diffusion layer 62 and the isolation region 53 affecting the breakdown voltage characteristics of the NPN transistor 51.

As the solid line shows, the longer the distance L2 is, the more the breakdown voltage characteristics of the NPN transistor 51 are improved, when the distance L2 is not longer than about 1.0 μm. The breakdown voltage of the NPN transistor 51 are stable at approximately 15.0V, when the distance L2 is about 1.0 μm or longer. Specifically, by forming the N type buried diffusion layer 64 and the N type diffusion layer 65 in the NPN transistor 51, it is possible to reduce the influence of the distance L2 and obtain the stable breakdown voltage characteristics.

As the dotted line shows, in a case where the N type buried diffusion layer 64 and the N type diffusion layer 65 are not formed, on the other hand, the longer the distance L2 is, the more the breakdown voltage characteristics of the NPN transistor 51 are improved. However, compared with the case shown by the solid line, it is understood that the breakdown voltage characteristics of the NPN transistor 51 are not stable. Especially when the distance L2 is not longer than about 2.0 μm, the breakdown voltage characteristics of the NPN transistor 51 significantly vary depending on the distance L2. Hence, it is difficult to reduce the device size of the NPN transistor 51.

Furthermore, in this embodiment, the isolation regions 53, 54 and 55 are formed by connecting P type buried diffusion layers 95, 96 and 97, which expand from a surface of the first epitaxial layer 57, to P type diffusion layers 98, 99 and 100, respectively, which expand from a surface of the second epitaxial layer 58. Each of the P type buried diffusion layers 95, 96 and 97 is connected to the substrate 56.

Although varying depending on the breakdown voltage characteristics of the NPN transistor 51, descriptions will be provided for a case where the total thickness of the epitaxial layers 57 and 58 is, for instance, about 2.1 (μm). The first epitaxial layer 57 has a thickness of about 0.6 (μm), and the second epitaxial layer 58 has a thickness of about 1.5 (μm). In this case, each of the P type buried diffusion layers 95, 96 and 97 expands upward to a side of the epitaxial layer 7 by about 0.6 (μm). Moreover, each of lateral expansion widths W1, W2 and W3 respectively of the P type buried diffusion layers 95, 96 and 97 is about 0.48 (μm). This is because, each of the lateral expansion widths of the diffusion layer is about 0.8 times an upward expansion width (or downward expansion width) of the diffusion layer, although the lateral expansion widths vary depending on a crystalline state of the epitaxial layer and the like.

Figure 17:
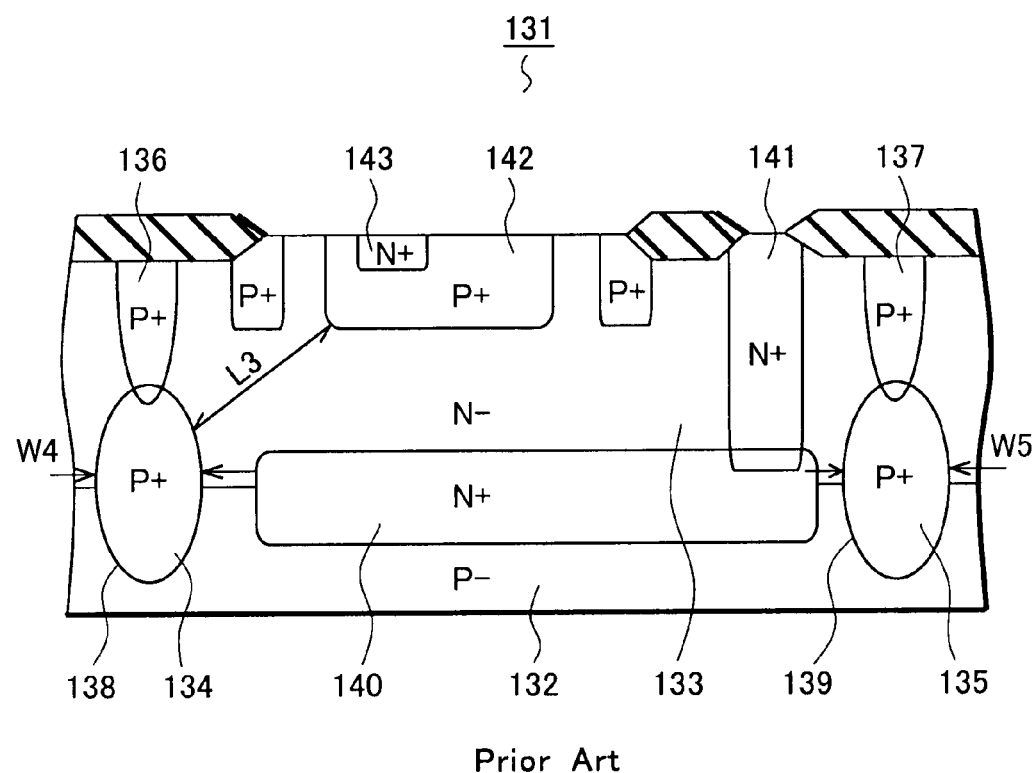
FIG. 17 is a cross-sectional view illustrating a semiconductor device according to a conventional embodiment.

On the other hand, as described using FIG. 17, the case of the conventional structure will be considered in which a single epitaxial layer 133 which has a thickness of 2.1 μm, is deposited on a substrate 132. In this case, in order to expand P type buried diffusion layers 134 and 135 from the surface of the substrate 132, the P type buried diffusion layers 134 and 135 expand upward to the side of the epitaxial layer 133 by about 1.2 (μm). The P type buried diffusion layers 134 and 135 have respectively lateral expansion widths W4 and W5 each of about 0.96 (μm) as in the above case.

Specifically, the P type buried diffusion layers 95, 96 and 97 shown in FIG. 3 expand vertically (in a depth direction) from the surface of the first epitaxial layer 57, and hence, expansion widths thereof are regulated. Thereby, it is possible to realize the reduced lateral expansion widths W1, W2 and W3. In addition, as in the case with the conventional structure, the distance L2 between the P type diffusion layer 62 and the P type isolation region 53 needs to be a certain distance depending on the breakdown voltage characteristics of the NPN transistor 51. Meanwhile, it is possible to reduce the device size of the NPN transistor 51 by reducing the lateral expansion widths W1, W2 and W3 respectively of the P type buried diffusion layers 95, 96 and 97. Furthermore, as described, by forming the N type buried diffusion layer 64 and the N type diffusion layer 65, it is possible to realize the shorter distance L2 while maintaining the breakdown voltage characteristics, and to reduce the device size of the NPN transistor 51.

Note that, in this embodiment, various design modifications can be made for the disposition regions of the N type buried diffusion layer 64 and the N type diffusion layer 65, depending on the breakdown voltage characteristics of the NPN transistor 51. For instance, the N type buried diffusion layer 64 and the N type diffusion layer 65 are not necessarily disposed in a region where the N type buried diffusion layer 60 and the N type diffusion layer 61 are disposed between the P type diffusion layer 62 and each of the P type isolation regions 53 and 54. In addition, the N type buried diffusion layer 64 and the N type diffusion layer 65 are not necessarily disposed in a region where desired breakdown voltage characteristics are secured by the distance L2 between the P type diffusion layer 62 and each of the P type isolation regions 53 and 54. In other words, it suffices that the N type buried diffusion layer 64 and the N type diffusion layer 65 are at least disposed in the region where any N type diffusion layer is not formed between the P type diffusion layer 62 and each of the P type isolation regions 53 and 54, and where the distance L2 between the P type diffusion layer 62 and each of the P type isolation regions 53 and 54 is shorter.

In this embodiment, the descriptions have been provided for the case where the two epitaxial layers 57 and 58 are stacked on the substrate 56. However, the present invention is not limited to this case. For instance, even in a case where not less than three epitaxial layers are stacked on the substrate, it is possible to obtain effects similar to those of the embodiment by forming N type diffusion layers between a base region and a isolation region.

As shown in FIG. 3, a dotted line indicates a boundary region between the substrate 56 and the first epitaxial layer 57. As described, the substrate 56 contains P type impurities, and thus P type diffusion regions are formed in the epitaxial layer 57 as expanding up from the substrate 56. The P type buried diffusion layers 95, 96 and 97 in this structure connect respectively to the P type diffusion regions. Hence, the lateral expansion widths W1, W2 and W3 respectively of the P type buried diffusion layers 95, 96 and 97 are further regulated. Accordingly, the device size of the NPN transistor 51 is reduced.

In this embodiment, the descriptions have been provided for the following case. The P type buried diffusion layers 95, 96 and 97 are expanded from the surface of the first epitaxial layer 57, and the P type diffusion layers 98, 99 and 100 are expanded from the surface of the second epitaxial layer 58. Hence, the isolation regions 53, 54 and 55 are formed. However, the present invention is not limited to this case. For instance, the present invention can be applied to a case where P type buried diffusion layers are additionally formed from the surface of the substrate 56 so that the isolation regions 53, 54 and 55 are formed of the additional P type buried diffusion layers, the P type buried diffusion layers 95, 96 and 97 and the P type diffusion layers 98, 99 and 100. In this case, it is possible to realize the further reductions of lateral expansion widths W1, W2 and W3 respectively of the P type buried diffusion layers 95, 96 and 97.

Next, by referring to FIGS. 5 to 10, detailed descriptions will be provided for a third example of a method of manufacturing a semiconductor device of the embodiment of the present invention. FIGS. 5 to 10 are cross-sectional views illustrating the method of manufacturing a semiconductor device according to the embodiment.

Figure 5:
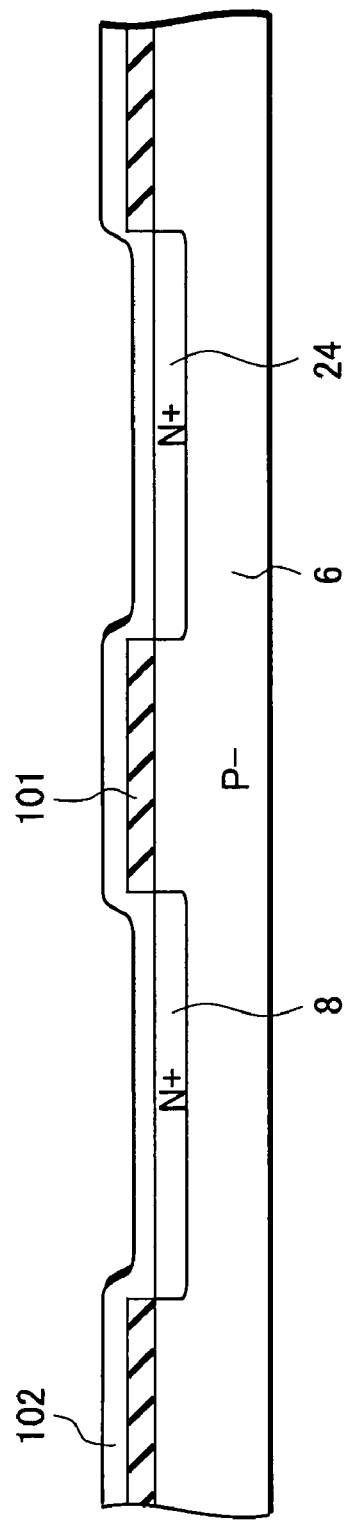
FIG. 5 is a cross-sectional view illustrating a first method of manufacturing a semiconductor device according to an embodiment of the present invention.

First, as shown in FIG. 5, a P type single crystal silicon substrate 6 is prepared. A silicon oxide film 101 is formed on the substrate 6, and then the silicon oxide film 101 is selectively removed so as to form openings in formation regions of N type buried diffusion layers 8 and 24. Thereafter, the silicon oxide film 101 is used as a mask, and a liquid source 102 containing N type impurities such as antimony (Sb) is applied onto a surface of the substrate 6 by a spin-coating method. Subsequently, the antimony (Sb) is thermally diffused to form the N type buried diffusion layers 8 and 24. Thereafter, the silicon oxide film 101 and the liquid source 102 are removed.

Figure 6:
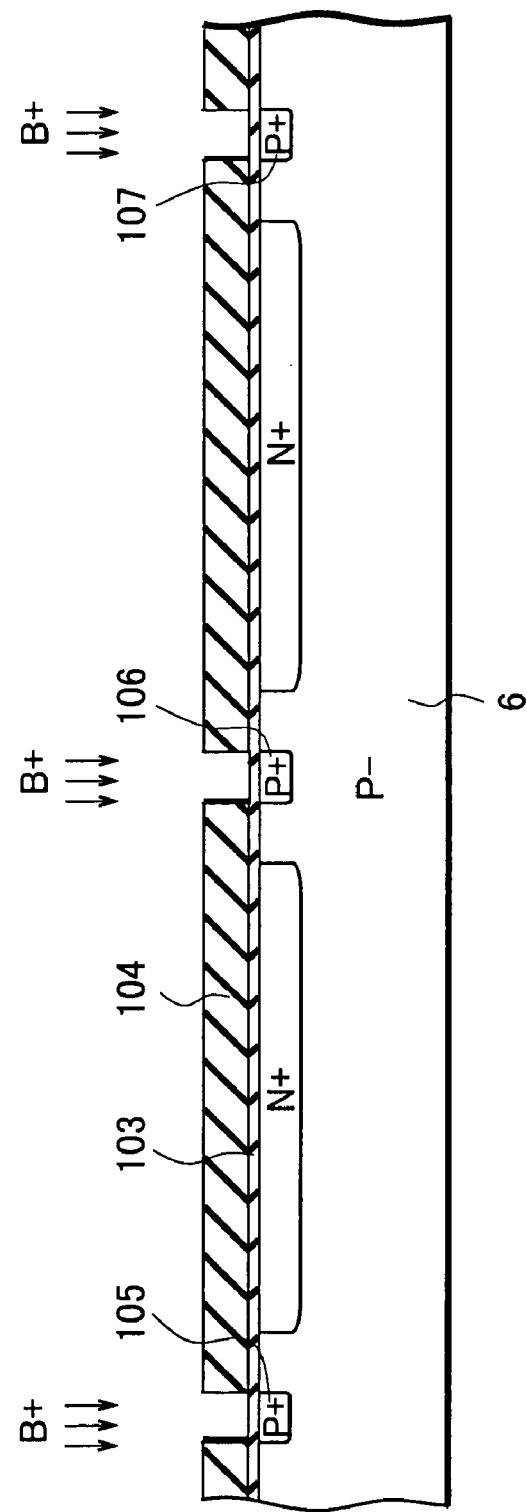
FIG. 6 is a cross-sectional view illustrating the first method of manufacturing a semiconductor device according to the embodiment of the present invention.

Next, as shown in FIG. 6, a silicon oxide film 103 is formed on the substrate 6, and then a photoresist 104 is formed on the silicon oxide film 103. Thereafter, by use of a known photolithography technique, openings are formed in the photoresist 104 on regions where P type buried diffusion layers 105, 106 and 107 are to be formed. Subsequently, ions of P type impurities such as boron (B) are implanted from the surface of the substrate 6 at an accelerating voltage of 180 to 200 (keV) and a dose of $1.0 \times 10^{12}$ to $1.0 \times 10^{14}$ ions (/cm$^2$).

Figure 7:
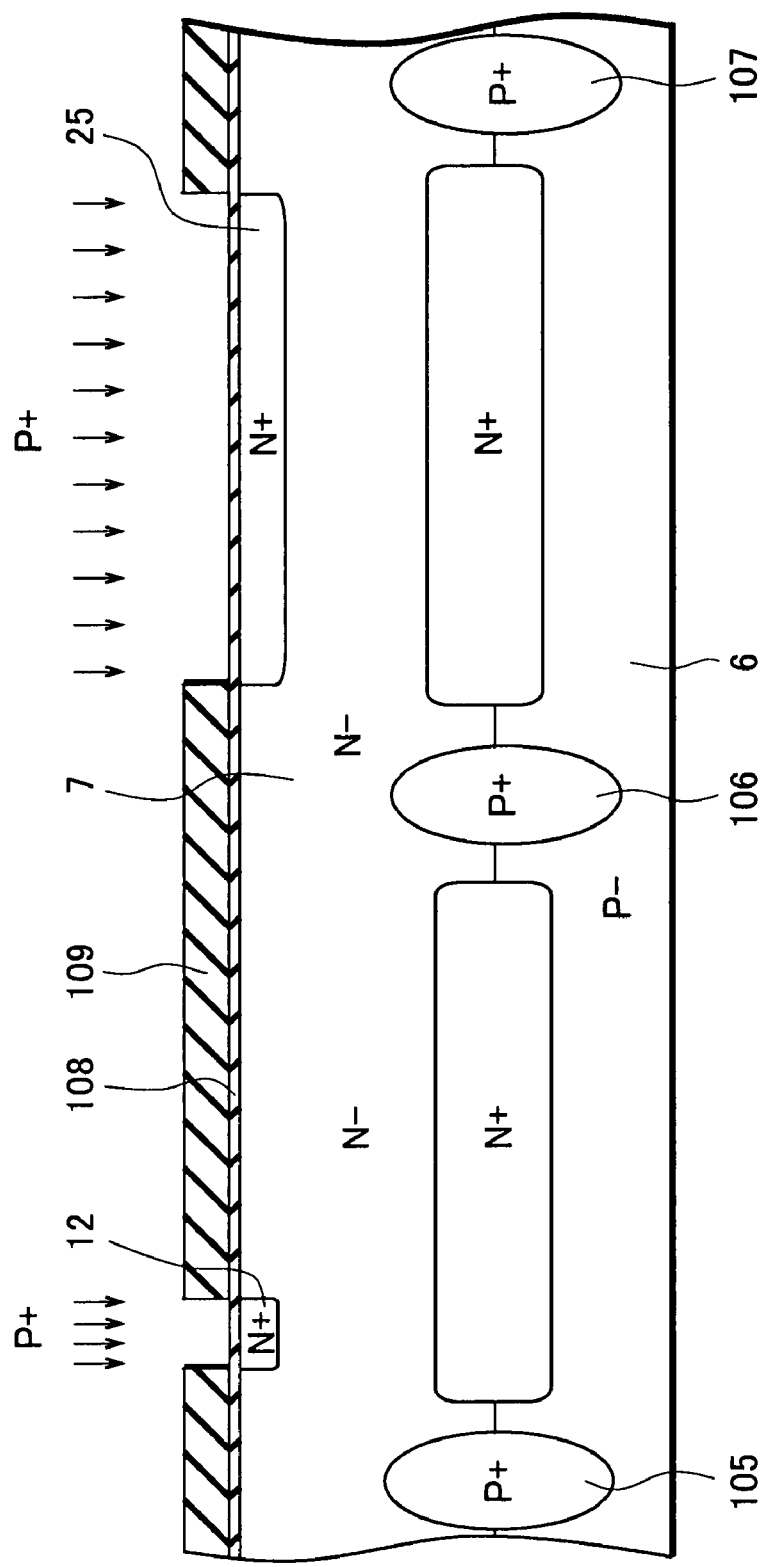
FIG. 7 is a cross-sectional view illustrating the first method of manufacturing a semiconductor device according to the embodiment of the present invention.

Subsequently, the substrate 6 is placed on a susceptor of a vapor phase epitaxial growth apparatus, and an N type epitaxial layer 7 is formed on the substrate 6 as shown in FIG. 7. The epitaxial layer 7 is formed to a thickness of about 2.0 to 2.1 (μm). The P type buried diffusion layers 105, 106 and 107 are expanded by heat treatment in the step of forming the epitaxial layer 7 in thermal diffusion. Thereafter, a silicon oxide film 108 is formed on the epitaxial layer 7, and then a photoresist 109 is formed on the silicon oxide film 108. By use of the known photolithography technique, openings are formed in the photoresist 109 on regions where N type diffusion layers 12 and 25 are to be formed. Subsequently, ions of N type impurities such as phosphorus (P) are implanted from the surface of the epitaxial layer 7 at an accelerating voltage of 70 to 90 (keV) and a dose of $1.0 \times 10^{11}$ to $1.0 \times 10^{13}$ ions (/cm$^2$). The photoresist 109 is then removed, and the N type impurities are expanded by thermal diffusion to form the N type diffusion layers 12 and 25. Thereafter, the silicon oxide film 108 is removed.

In this embodiment, the same mask and the same ion implanting step are used to form the N type diffusion layer 12 of an NPN transistor 1 and the N type diffusion layer 25 of the P channel MOS transistor 2. Hence, it is possible to improve the breakdown voltage characteristics of the NPN transistor 1 without using an increased number of masks.

Figure 8:
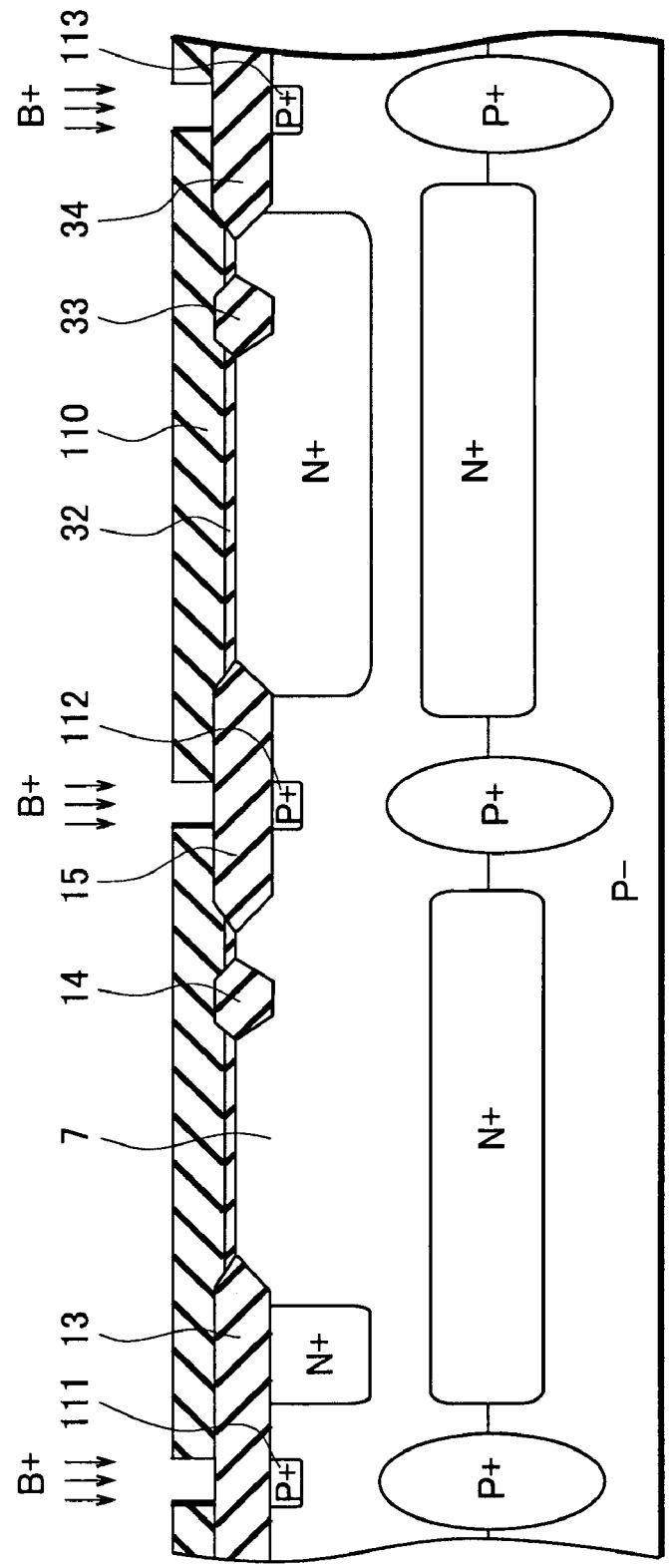
FIG. 8 is a cross-sectional view illustrating the first method of manufacturing a semiconductor device according to the embodiment of the present invention.

Next, as shown in FIG. 8, LOCOS oxide films 13, 14, 15, 33 and 34 are formed respectively in desired regions of the epitaxial layer 7. A silicon oxide film to be used as a gate oxide film 32 is formed on the upper face of the epitaxial layer 7. Subsequently, a photoresist 110 is formed on the silicon oxide film. By use of the known photolithography technique, openings are formed in the photoresist 110 on regions where P type diffusion layers 111, 112 and 113 are to be formed. Thereafter, ions of P type impurities such as boron (B) are implanted from the surface of the epitaxial layer 7 at an accelerating voltage of 150 to 170 (keV) and a dose of $1.0 \times 10^{12}$ to $1.0 \times 10^{14}$ ions (/cm$^2$). The photoresist 110 is then removed, and the P type impurities are expanded by thermal diffusion to form the P type diffusion layers 111, 112 and 113.

After the LOCOS oxide films 13, 15 and 34 are formed, ions of boron (B) are implanted from upper faces of the respective LOCOS oxide films 13, 15 and 34. This manufacturing method can prevent the formation of crystal defects due to heat caused when the LOCOS oxide films 13, 15 and 34 are formed. The crystal defects are formed from the surface of the epitaxial layer 7 damaged because of the implantation of the ions of boron (B) of a relatively large molecule level.

Figure 9:
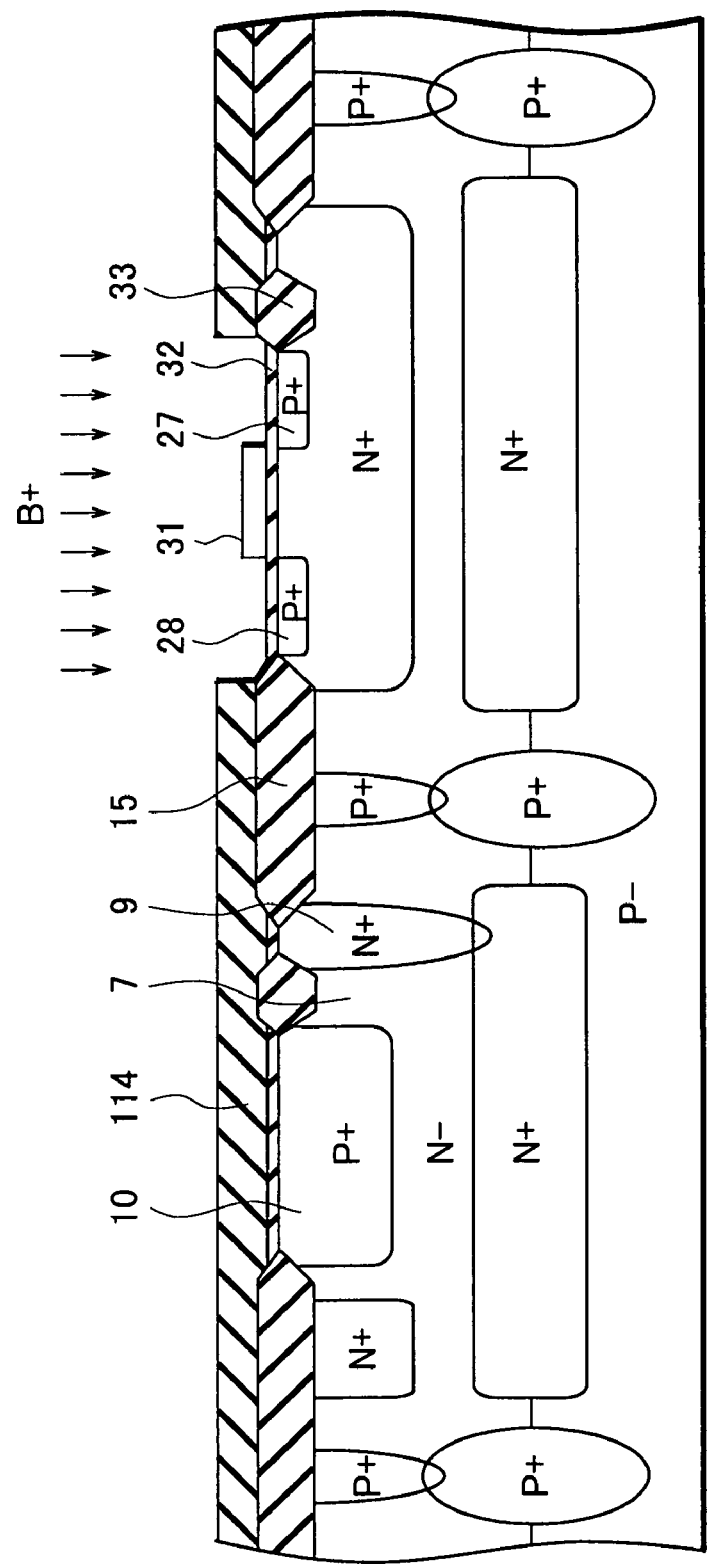
FIG. 9 is a cross-sectional view illustrating the first method of manufacturing a semiconductor device of the embodiment of the present invention.

As shown in FIG. 9, a photoresist (not shown) having an opening above a formation region of an N type diffusion layer 9 is used as a mask, and the N type diffusion layer 9 is formed by use of, for instance, an ion implantation method. Note that, depending on the depth of the N type diffusion layer 9 to be formed, the method of forming the N type diffusion layer 9 may include a diffusing step performed after ions are implanted. In addition, a photoresist (not shown) having an opening above a formation region of a P type diffusion layer 10 is used as a mask, and the P type diffusion layer 9 is formed by use of, for instance, the ion implantation method. Thereafter, films such as a polysilicon film and a tungsten silicide film are sequentially formed on the gate oxide film 32 to form a gate electrode 31 by use of the known photolithography technique. Subsequently, a photoresist 114 is formed on the silicon oxide film used as the gate oxide film 32. By use of the known photolithography technique, openings are formed in the photoresist 114 on regions where P type diffusion layers 27 and 28 are to be formed. Subsequently, ions of P type impurities such as boron (B) are implanted from the surface of the epitaxial layer 7 to form the P type diffusion layers 27 and 28. In the forming, since the LOCOS oxide films 15 and 33 and the gate electrode 31 are used as masks, the P type diffusion layers 27 and 28 can be formed with higher positional accuracy. Thereafter, the photoresist 114 is removed.

Figure 10:
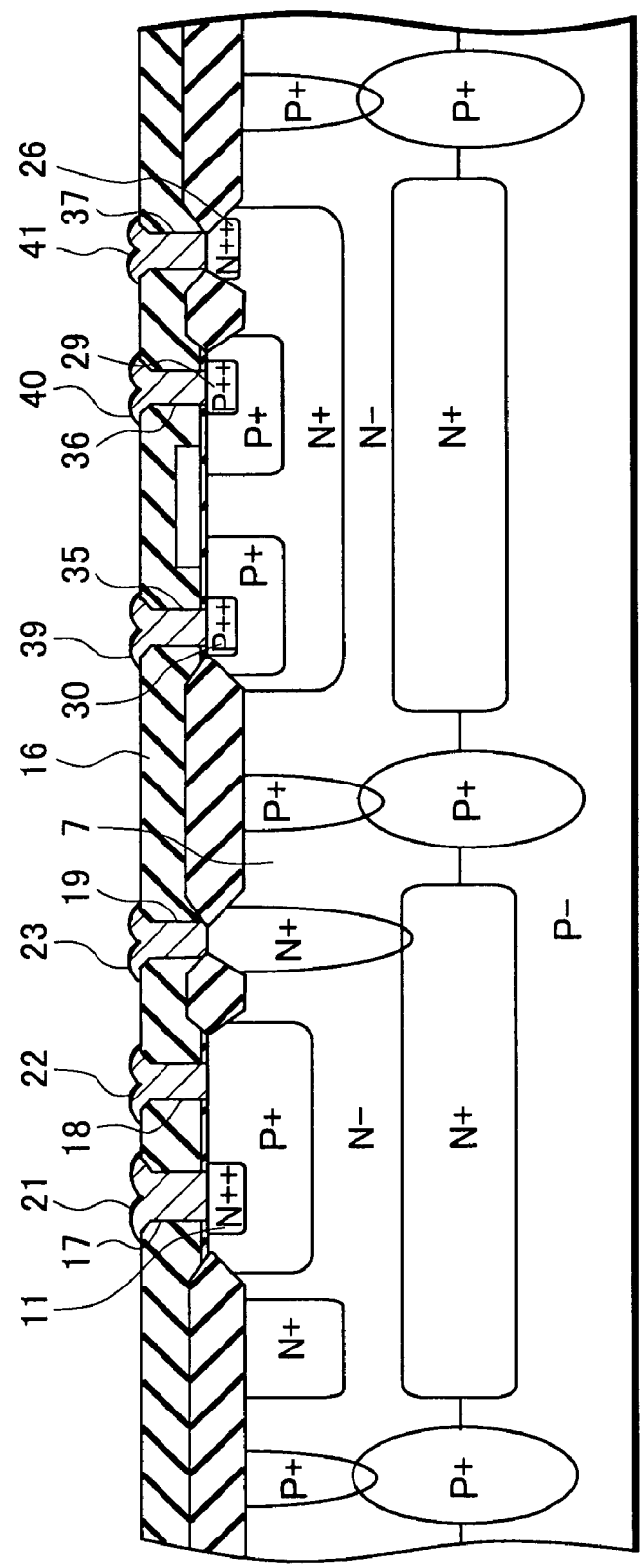
FIG. 10 is a cross-sectional view illustrating the first method of manufacturing a semiconductor device according to the embodiment of the present invention.

Next, as shown in FIG. 10, by use of the known photolithography technique, P type diffusion layers 29 and 30 are formed, and then N type diffusion layers 11 and 26 are formed.

Thereafter, on the epitaxial layer 7, a film such as an NSG film, a BPSG film or the like is deposited as an insulating layer 16. Subsequently, by use of the known photolithography technique, contact holes 17, 18, 19, 35, 36 and 37 are formed in the insulating layer 16 by dry etching using, for instance, CHF$_3$ or CF$_4$ gas. In the contact holes 17, 18, 19, 35, 36 and 37, aluminum alloy films made of, for instance, an Al—Si film, an Al—Si—Cu film, an Al—Cu film and the like are selectively formed. Hence, an emitter electrode 21, a base electrode 22, a collector electrode 23, a drain electrode 39, a source electrode 40 and a back gate electrode 41 are formed.

Next, by referring to FIGS. 11 to 16, detailed descriptions will be provided for a fourth example of a method of manufacturing a semiconductor device according to the embodiment of the present invention. FIGS. 11 to 16 are cross-sectional views illustrating the method of manufacturing a semiconductor device according to the embodiment.

Figure 11:
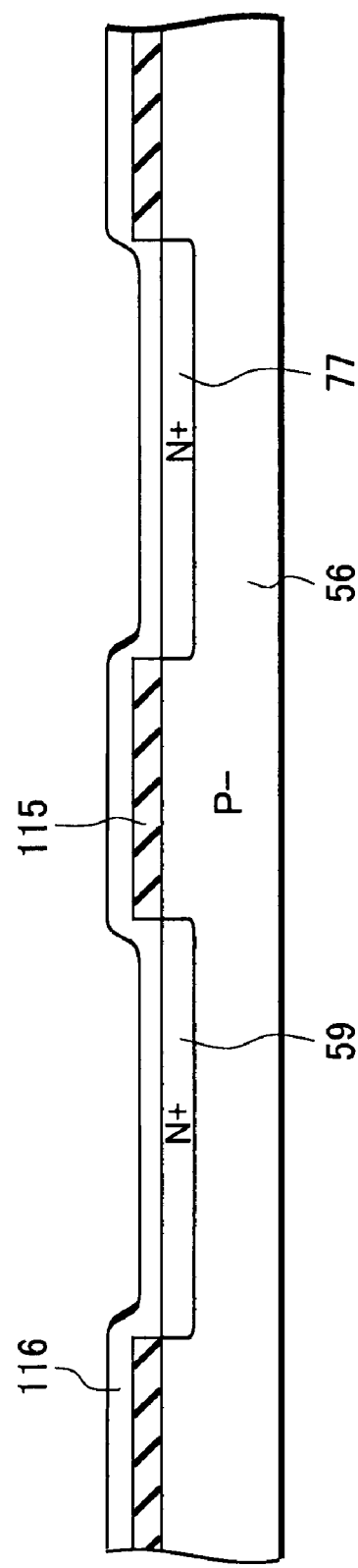
FIG. 11 is a cross-sectional view illustrating a second method of manufacturing a semiconductor device according to an embodiment of the present invention.

First, as shown in FIG. 11, a P type single crystal silicon substrate 56 is prepared. A silicon oxide film 115 is formed on the substrate 56, and the silicon oxide film 115 is then selectively removed so as to form openings above formation regions of N type buried diffusion layers 59 and 77. Thereafter, the silicon oxide film 115 is used as a mask, and a liquid source 116 containing N type impurities such as antimony (Sb) is applied onto a surface of the substrate 56 by a spin-coating method. The antimony (Sb) is then thermally diffused to form the N type buried diffusion layers 59 and 77. Thereafter, the silicon oxide film 115 and the liquid source 116 are removed.

Figure 12:
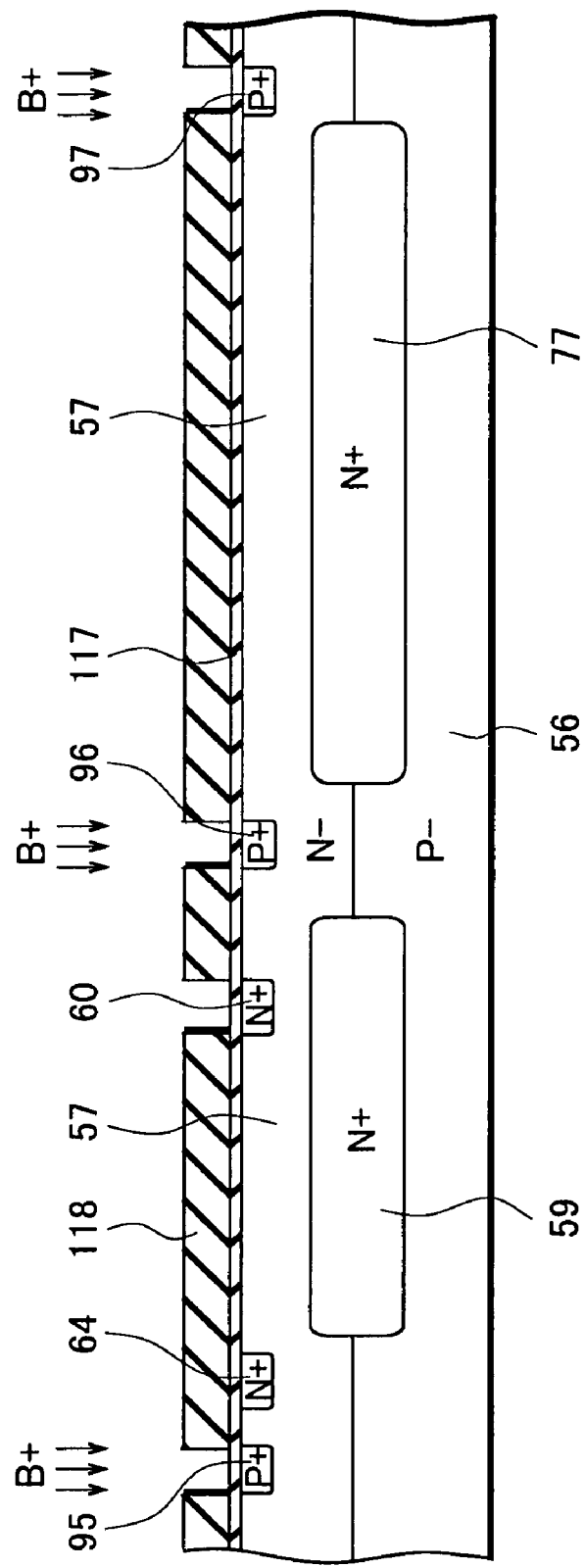
FIG. 12 is a cross-sectional view illustrating the second method of manufacturing a semiconductor device according to the embodiment of the present invention.

Subsequently, as shown in FIG. 12, the substrate 56 is placed on a susceptor of a vapor phase epitaxial growth apparatus, and an N type epitaxial layer 57 is formed on the substrate 56. The epitaxial layer 57 is formed to a thickness of about 0.6 to 1.0 (μm). The N type buried diffusion layers 59 and 77 are expanded by heat treatment in the step of forming the epitaxial layer 57 in thermal diffusion. Thereafter, a silicon oxide film 117 is formed on the epitaxial layer 57. A photoresist (not shown) having openings above formation regions of N type buried diffusion layers 60 and 64 to be described later, is used as a mask, and the N type buried diffusion layers 60 and 64 are formed by use of, for instance, an ion implantation method. Note that, the step of forming the N type buried diffusion layer 60 may be omitted.

Subsequently, a photoresist 118 is formed on the silicon oxide film 117. By use of a known photolithography technique, openings are formed in the photoresist 118 on regions where P type buried diffusion layers 95, 96 and 97 are to be formed. Subsequently, ions of P type impurities such as boron (B) are implanted from a surface of the epitaxial layer 57 at an accelerating voltage of 180 to 200 (keV) and a dose of $1.0 \times 10^{12}$ to $1.0 \times 10^{14}$ ions/(cm$^2$). Note that, in this embodiment, the ion-implanted P type buried diffusion layers 95, 96 and 97 have the concentration peaks of the impurity respectively in positions about 0.2 to 0.3 (μm) deep from the surface of the epitaxial layer 57. More specifically, by arbitrarily changing the acceleration voltage of ion implantation, it is possible to arbitrarily adjust the positions determined by the ion implantation, where the concentrations of the impurities are peak. Hence, depending on the positions, it is possible to adjust positions where the P type buried diffusion layers 95, 96 and 97 are formed. Thereafter, the silicon oxide film 117 and the photoresist 118 are removed while the P type buried diffusion layers 95, 96 and 97 are not expanded by thermally diffusion.

Figure 13:
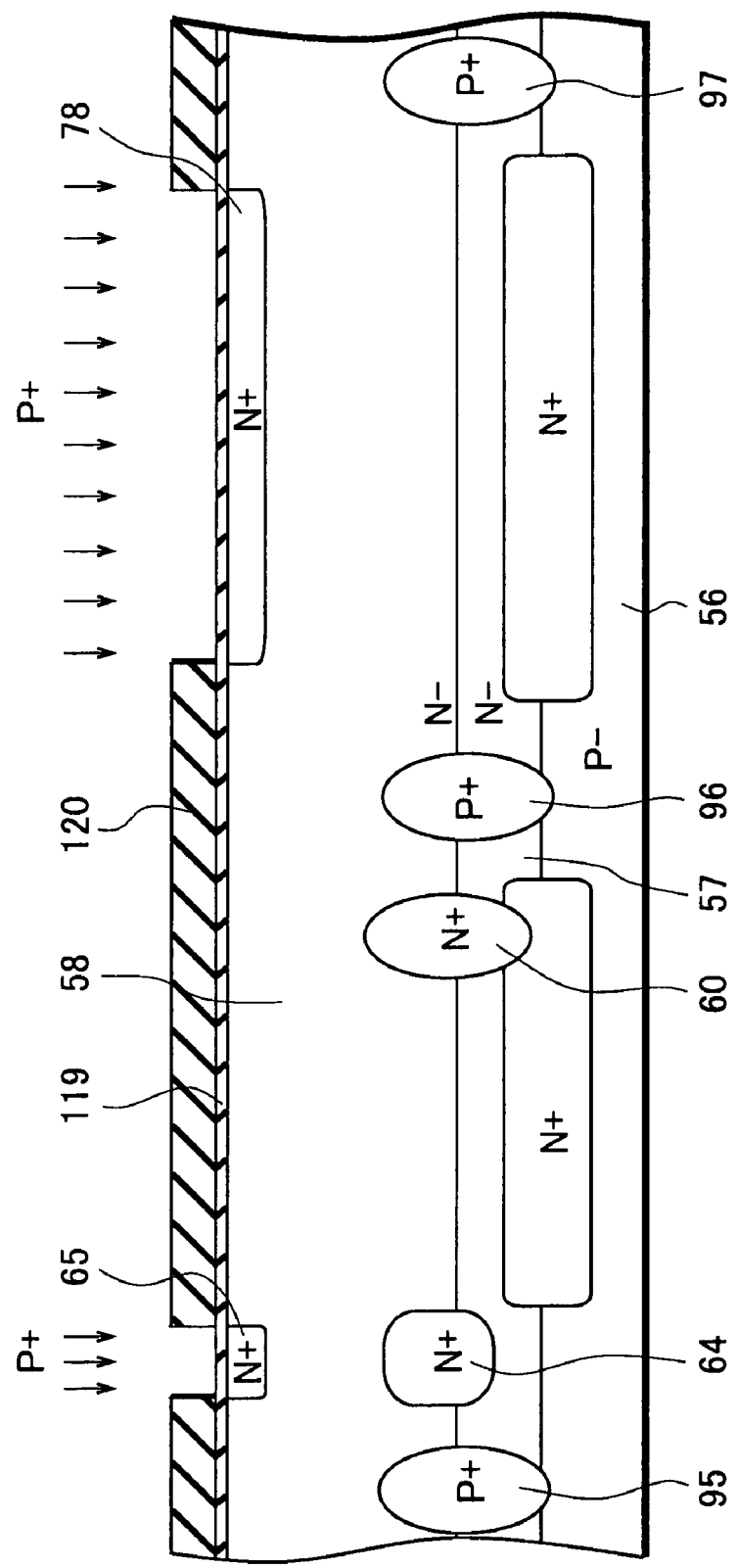
FIG. 13 is a cross-sectional view illustrating the second method of manufacturing a semiconductor device according to the embodiment of the present invention.

Next, as shown in FIG. 13, the substrate 56 is placed on the susceptor of the vapor phase epitaxial growth apparatus, and an N type epitaxial layer 58 is formed on the epitaxial layer 57. The epitaxial layer 58 is formed to have a thickness of about 1.0 to 1.5 (μm). The total thickness of the epitaxial layers 57 and 58 is, for instance, about 2.0 to 2.1 (μm). The ions of the P type buried diffusion layers 95, 96 and 97 are expanded by heat treatment in the step of forming the epitaxial layer 58 in thermal diffusion.

Thereafter, a silicon oxide film 119 is formed on the epitaxial layer 58, and then a photoresist 120 is formed on the silicon oxide film 119. By use of the known photolithography technique, openings are formed in the photoresist 120 on regions where N type diffusion layers 65 and 78 are to be formed. Subsequently, ions of N type impurities such as phosphorus (P) are implanted from an surface of the epitaxial layer 58 at an accelerating voltage of 70 to 90 (keV) and a dose of $1.0 \times 10^{11}$ to $1.0 \times 10^{13}$ ions (/cm$^2$). The photoresist 120 is then removed, and the N type impurities are expanded by thermal diffusion to form the N type diffusion layers 65 and 78. Thereafter, the silicon oxide film 119 is removed (see FIG. 14).

In the embodiment, the same mask and the same ion implanting step are used to form the N type diffusion layer 65 of an NPN transistor 51 and the N type diffusion layer 78 of a P channel MOS transistor 52. Hence, it is possible to improve breakdown voltage characteristics of an NPN transistor 51 without using an increased number of masks.

Figure 14:
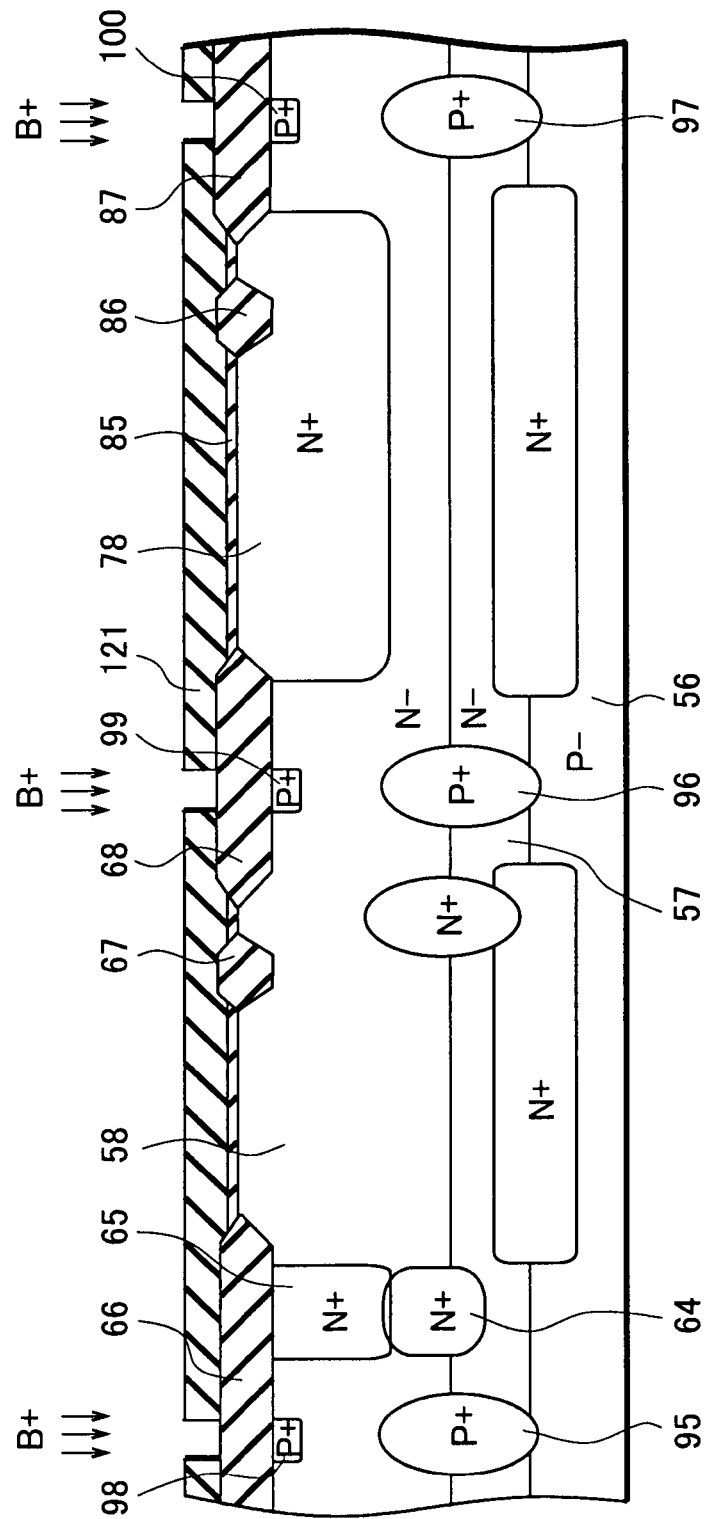
FIG. 14 is a cross-sectional view illustrating the second method of manufacturing a semiconductor device according to the embodiment of the present invention.

As illustrate in FIG. 14, LOCOS oxide films 66, 67, 68, 86 and 87 are formed respectively in desired regions of the epitaxial layer 58. A silicon oxide film used as a gate oxide film 85 is formed on an upper face of the epitaxial layer 58. Subsequently, a photoresist 121 is formed on the silicon oxide film. By use of the known photolithography technique, openings are formed in the photoresist 121 on regions where P type diffusion layers 98, 99 and 100 are formed. Thereafter, ions of P type impurities such as boron (B) are implanted from the surface of the epitaxial layer 58 at an accelerating voltage of 150 to 170 (keV) and a dose of $1.0 \times 10^{12}$ to $1.0 \times 10^{14}$ ions (/cm$^2$). The photoresist 121 is then removed, and the ions of the P type impurities are expanded by thermally diffusion to form the P type diffusion layers 98, 99 and 100 (see FIG. 15).

In the above step, after the epitaxial layer 58 is formed, the P type diffusion layers 98, 99 and 100 are formed without performing the thermal diffusion step for expanding the P type buried diffusion layers 95, 96 and 97. By adjusting a thickness of the epitaxial layer 57 in this manufacturing step, it is possible to omit the thermal diffusion step for expanding the P type buried diffusion layers 95, 96 and 97, the thermal diffusion step being necessary in the conventional manufacturing method. In comparison with the conventional manufacturing step, one thermal diffusion step of the above type for the P type buried diffusion layers 95, 96 and 97 can be omitted. In addition, it is possible to realize the reduced lateral expansion widths W1, W2 and W3 respectively (see FIG. 3) of the P type buried diffusion layers 95, 96 and 97. Thereby, it is possible to reduce the device size of the NPN transistor 51.

After the LOCOS oxide films 66, 68 and 87 are formed, ions of boron (B) are implanted from the upper faces of the respective LOCOS oxide films 66, 68 and 87. The manufacturing method prevents formation of crystal defects due to heat caused when the LOCOS oxide films 66, 68 and 87 are formed. The crystal defects are formed from the surface of the epitaxial layer 58 damaged because of the implantation of the ions of boron (B) of a relatively large molecule level.

Figure 15:
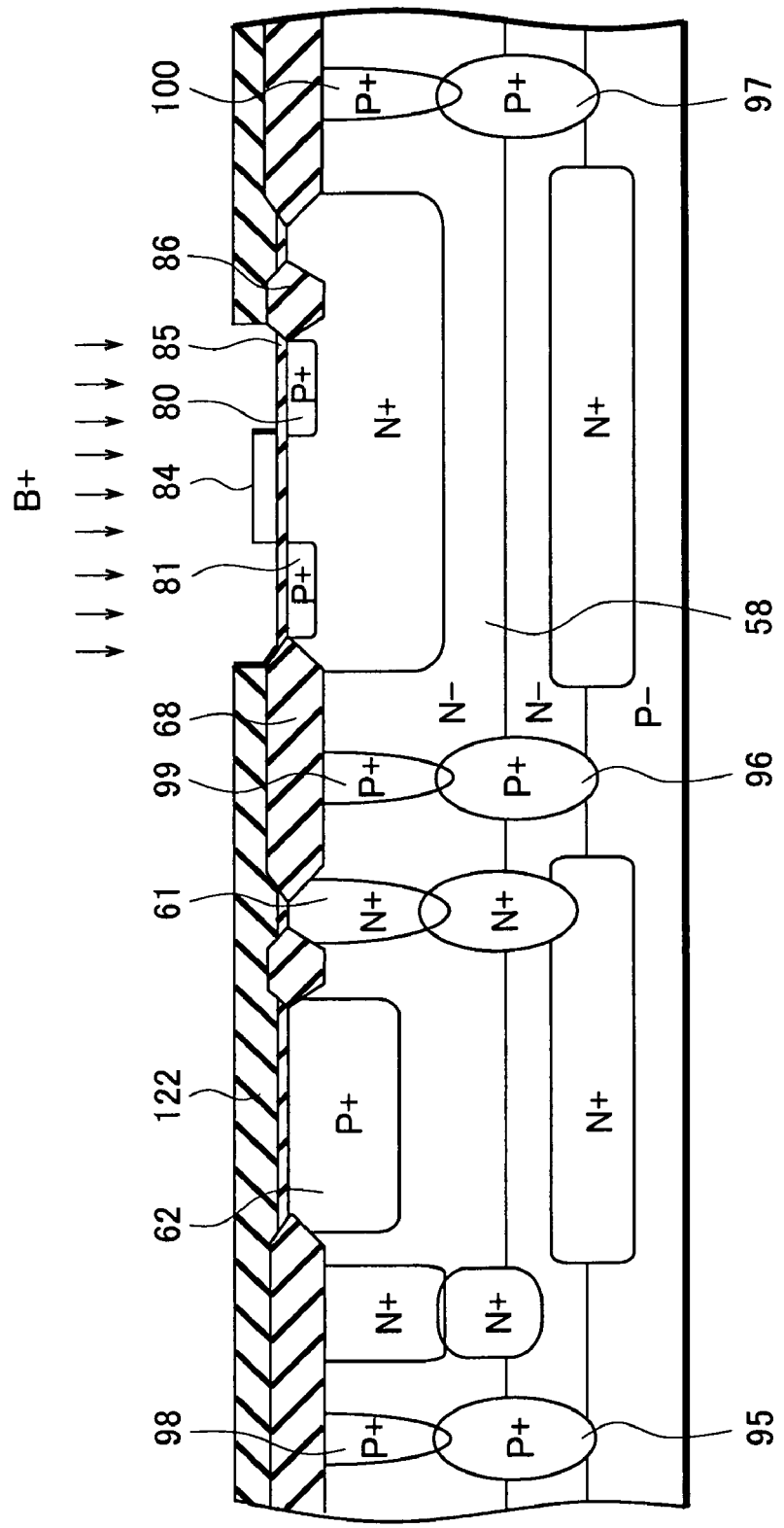
FIG. 15 is a cross-sectional view illustrating the second method of manufacturing a semiconductor device according to the embodiment of the present invention.

Subsequently, as shown in FIG. 15, a photoresist (not shown) having an opening above a formation region of an N type diffusion layer 61 is used as a mask, and the N type diffusion layer 61 is formed by use of, for instance, the ion implantation method. Note that, depending on the depth of the N type diffusion layer 61 to be formed, the method of forming the N type diffusion layer 61 may include the diffusing step performed after ions are implanted. In addition, a photoresist (not shown) having an opening above a formation region of a P type diffusion layer 62 is used as a mask, and the P type diffusion layer 62 is formed by use of, for instance, the ion implantation method. Thereafter, films such as a polysilicon film and a tungsten silicide film are sequentially formed on the gate oxide film 85 to form a gate electrode 84 by use of the known photolithography technique. Subsequently, a photoresist 122 is formed on the silicon oxide film used as the gate oxide film 85. By use of the known photolithography technique, openings are formed in the photoresist 122 on regions where P type diffusion layers 80 and 81 are to be formed. Subsequently, ions of P type impurities such as boron (B) are implanted from the surface of the epitaxial layer 58 to form the P type diffusion layers 80 and 81. In the forming, since the LOCOS oxide films 68 and 86 and the gate electrode 84 are used as masks, the P type diffusion layers 80 and 81 can be formed with higher positional accuracy. Thereafter, the photoresist 122 is removed.

Figure 16:
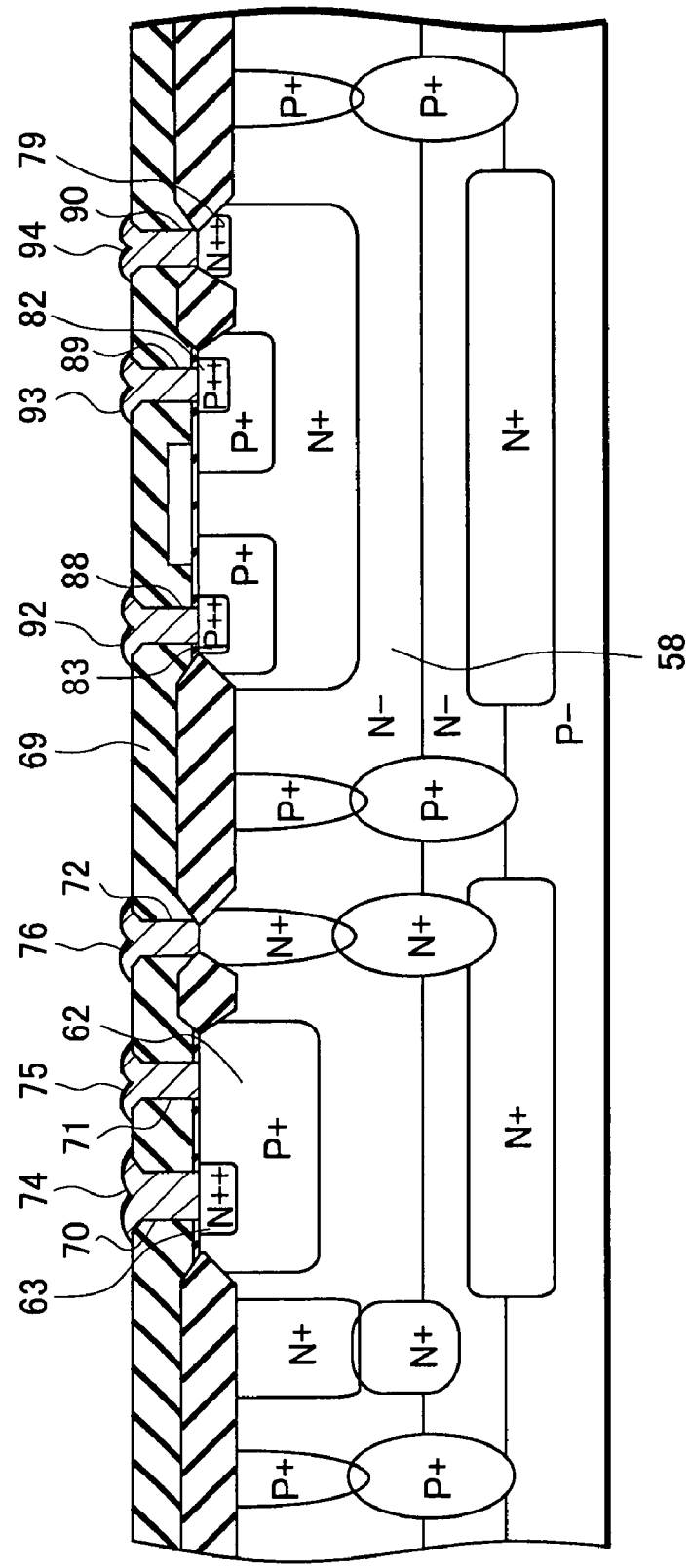
FIG. 16 is a cross-sectional view illustrating the second method of manufacturing a semiconductor device according to the embodiment of the present invention.

Next, as shown in FIG. 16, by use of the known photolithography technique, P type diffusion layers 82 and 83 are formed, and then N type diffusion layers 63 and 79 are formed.

Thereafter, on the epitaxial layer 58, a film such as an NSG film, a BPSG film or the like is deposited as an insulating layer 69. By use of the known photolithography technique, contact holes 70, 71, 72, 88, 89 and 90 are formed in the insulating layer 69 by dry etching using, for instance, CHF$_3$ or CF$_4$ gas. In the contact holes 70, 71, 72, 88, 89 and 90, aluminum alloy films made of, for instance, an Al—Si film, an Al—Si—Cu film, an Al—Cu film or the like are selectively formed. Hence, an emitter electrode 74, a base electrode 75, a collector electrode 76, a drain electrode 92, a source electrode 93 and a back gate electrode 94 are formed.

Note that, in the embodiment, the following case has been described. The P type buried diffusion layers 95, 96 and 97 are expanded from the surface of the first epitaxial layer 57, and the P type diffusion layers 98, 99 and 100 are expanded from the surface of the second epitaxial layer 58. Accordingly, isolation regions 53, 54 and 55 are formed, respectively. However, the present invention is not limited to this case. For instance, the present invention can be applied to a case where P type buried diffusion layers are additionally formed from the surface of the substrate 56, and where the isolation regions 53, 54 and 55 are formed of the additional P type buried diffusion layers, the P type buried diffusion layers 95, 96 and 97, and the P type diffusion layers 98, 99 and 100, respectively. In this case, it is possible to realize the further-reduced lateral expansion widths W1, W2 and W3 respectively of the P type buried diffusion layers 95, 96 and 97.

In addition, in the embodiment, the case has been described where the N type buried diffusion layers 59 and 77 are formed so as to expand in the substrate 56 and the first epitaxial layer 57. However, the present invention is not limited to this. For instance, the present invention may be applied to a case where an N type buried diffusion layer is formed so as to expand in the first epitaxial layer 57 and the second epitaxial layer 58, and where the N type buried diffusion layer is connected to the N type buried diffusion layer 59. In this case, a collector resistance of the NPN transistor 51 can be reduced. In addition, various modifications can be made within a scope of the present invention.

In the embodiment of the present invention, the N type diffusion layer is formed between the base region of the NPN transistor and the isolation region. This structure makes the base and the isolation regions tend not to be short-circuited. Hence, it is possible to improve the breakdown voltage characteristics of the NPN transistor.

In the embodiment of the present invention, even in the structure in which a plurality of epitaxial layers are stacked on a substrate, the N type diffusion layer are formed between the base region of the NPN transistor and the isolation region. This structure makes the base and the isolation regions tend not to be short-circuited. Hence, it is possible to improve the breakdown voltage characteristics of the NPN transistor.

The two epitaxial layers are formed on the substrate in the embodiment of the present invention. The buried diffusion layers which form isolation regions expand from the surface of the first epitaxial layer. This structure can realize the reduced lateral expansion widths of the buried diffusion layers. Thereby, it is possible to reduce the device size of the semiconductor device.

In the embodiment of the present invention, by means of the same step, the N type diffusion layer, which improves the breakdown voltage characteristics of the NPN transistor, and the N type diffusion layer, which is the back gate region of the P channel MOS transistor, are formed. This manufacturing method can reduce the number of masks to be used. Thereby, the manufacturing costs can be reduced.

In the embodiment of the present invention, the buried diffusion layer which forms the isolation regions are formed from the surface of the first epitaxial layer, and the diffusion step dedicated for expanding the buried diffusion layers is not included in the manufacturing method. This manufacturing step can realize the reduced lateral expansion widths of the buried diffusion layers. Thereby, it is possible to reduce the device size of the semiconductor device.

In the embodiment of the present invention, after the LOCOS oxide film is formed, the diffusion layers which forms respectively the isolation regions are formed. This manufacturing method can reduce the crystal defects which are formed on the surfaces of the formation regions of the diffusion layers and in the adjacent regions.

What is claimed is:

1. A semiconductor device comprising:
   a semiconductor substrate of a first general conductivity type;
   an epitaxial layer of a second general conductivity type disposed on the semiconductor substrate;
   an isolation region of the first general conductivity type and isolating a portion of the epitaxial layer from another portion of the epitaxial layer;
   a buried diffusion layer of the second general conductivity type formed so as to extend in the semiconductor substrate and the epitaxial layer;
   a first diffusion layer of the second general conductivity type formed in the epitaxial layer so as to operate as part of a collector region;
   a diffusion layer of the first general conductivity type formed in the epitaxial layer so as to operate as a base region;
   a second diffusion layer of the second general conductivity type formed in the diffusion layer of the first general conductivity type so as to operate as an emitter region; and
   a third diffusion layer of the second general conductivity type formed in the epitaxial layer between the isolation region and the diffusion layer of the first general conductivity type,
   wherein the first diffusion layer of the second general conductivity type, the diffusion layer of the first general conductivity type, the second diffusion layer of the second general conductivity type and the third diffusion layer of the second general conductivity type are all disposed in a single portion of the epitaxial layer isolated by the isolation region,
   the single portion of the epitaxial layer isolated by the isolation region comprises no other isolation region so as not to be divided into two or more portions electrically isolated from each other, and
   the third diffusion layer of the second general conductivity type is not part of the collector region.

2. The semiconductor device according to claim 1, wherein the diffusion layer of the first general conductivity type is surrounded by the first diffusion layer of the second general conductivity type and the third diffusion layer of the second general conductivity type.

3. The semiconductor device according to claim 1, wherein the isolation region extends so as to be in contact with the semiconductor substrate.

4. A semiconductor device comprising:
   a semiconductor substrate of a first general conductivity type;
   a first epitaxial layer of a second general conductivity type disposed on the semiconductor substrate;
   a second epitaxial layer of the second general conductivity type disposed on the first epitaxial layer;
   an isolation region of the first general conductivity type and isolating a portion of the first and second epitaxial layers from another portion of the first and second epitaxial layers;
   a first buried diffusion layer of the second general conductivity type formed so as to extend in the semiconductor substrate and the first epitaxial layer;
   a first diffusion layer of the second general conductivity type formed in the second epitaxial layer so as to operate as part of a collector region;
   a first diffusion layer of the first general conductivity type formed in the second epitaxial layer so as to operate as a base region;
   a second diffusion layer of the second general conductivity type formed in the first diffusion layer of the first general conductivity type so as to operate as an emitter region;
   a second buried diffusion layer of the second general conductivity type formed so as to extend in the first and second epitaxial layers; and a third diffusion layer of the second general conductivity type formed in the second epitaxial layer and in contact with the second buried diffusion layer of the second general conductivity type, wherein the second buried diffusion layer of the second general conductivity type and the third diffusion layer of the second general conductivity type are disposed between the isolation region and the first diffusion layer of the first general conductivity type, the first diffusion layer of the second general conductivity type, the first diffusion layer of the first general conductivity type, the second diffusion layer of the second general conductivity type, the second buried diffusion layer of the second general conductivity type and the third diffusion layer of the second general conductivity type are all disposed in a single portion of the first and second epitaxial layers isolated by the isolation region, the single portion of the first and second epitaxial layers isolated by the isolation region comprises no other isolation region so as not to be divided into two or more portions electrically isolated from each other, and the third diffusion layer of the second general conductivity type is not part of the collector region.

5. The semiconductor device according to claim 4, wherein the first diffusion layer of the first general conductivity type is surrounded by the first and third diffusion layers of the second general conductivity type and the second buried diffusion layer of the second general conductivity type.

6. The semiconductor device according to claim 5, wherein the isolation region comprises a buried diffusion layer of the first general conductivity type formed in the semiconductor substrate and the first and second epitaxial layers and further comprises a second diffusion layer of the first general conductivity type formed in the second epitaxial layer so as to be in contact with the buried diffusion layer of the first general conductivity type.

7. The semiconductor device according to claim 4, wherein the isolation region extends so as to be in contact with the semiconductor substrate.

8. The semiconductor device according to claim 4, further comprising a third buried diffusion layer of the second general conductivity type formed so as to extend in the first and second epitaxial layers and to be in contact with the first buried diffusion layer and the first diffusion layer of the second general conductivity type.

\* \* \* \* \*